(12) United States Patent
Nagase

(10) Patent No.: US 10,109,354 B2
(45) Date of Patent: Oct. 23, 2018

(54) STORAGE DEVICE AND METHOD FOR MANAGING STORAGE DEVICE

(71) Applicant: RENESAS ELECTRONICS CORPORATION, Tokyo (JP)

(72) Inventor: Hirokazu Nagase, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/701,025

(22) Filed: Sep. 11, 2017

(65) Prior Publication Data

US 2018/0075911 A1    Mar. 15, 2018

(30) Foreign Application Priority Data

Sep. 13, 2016  (JP) ................. 2016-178194

(51) Int. Cl.
*G11C 11/34* (2006.01)
*G11C 16/04* (2006.01)
*G11C 16/10* (2006.01)
*G11C 16/32* (2006.01)

(52) U.S. Cl.
CPC .............. *G11C 16/10* (2013.01); *G11C 16/32* (2013.01)

(58) Field of Classification Search
CPC ................................ G11C 16/10; G11C 16/32
See application file for complete search history.

(56) References Cited

U.S. PATENT DOCUMENTS

| | | | |
|---|---|---|---|
| 9,607,691 B1* | 3/2017 | Allegra | G11C 11/5628 |
| 9,747,977 B2* | 8/2017 | Chu | G11C 13/0004 |
| 2011/0095255 A1* | 4/2011 | Sumino | H01L 45/145 257/2 |
| 2013/0227199 A1* | 8/2013 | Liu | G06F 12/0246 711/103 |
| 2017/0309331 A1* | 10/2017 | Tortorelli | G11C 13/004 |

FOREIGN PATENT DOCUMENTS

JP    2000-011670 A    1/2000

* cited by examiner

*Primary Examiner* — Toan Le
(74) *Attorney, Agent, or Firm* — McDermott, Will & Emery LLP

(57) ABSTRACT

A storage device includes a plurality of flash memory cells, a controller which writes data into a memory cell which is used as the cell which stores data therein in the plurality of flash memory cells and performs resetting of a threshold voltage of a timer cell used for decision of a threshold voltage of the memory cell in the plurality of flash memory cells and a level decision unit which estimates a state of a second threshold voltage which is the current threshold voltage of the memory cell on the basis of a first threshold voltage which is the current threshold voltage of the timer cell.

11 Claims, 13 Drawing Sheets

| THRESHOLD VOLTAGE OF TIMER CELL | ELAPSED TIME [hour] | THRESHOLD VOLTAGE (Vth_high) OF MEMORY CELL [V] | THRESHOLD VOLTAGE (Vth_low) OF MEMORY CELL [V] |
|---|---|---|---|
| 2.2 | 1000000 | -1.8 | 1.8 |
| 2.4 | 215444 | -1.3 | 1.3 |
| 2.6 | 46416 | -0.7 | 0.7 |
| 2.8 | 10000 | -0.2 | 0.2 |
| 3.0 | 2154 | 0.3 | -0.3 |
| 3.2 | 464 | 0.9 | -0.9 |
| 3.4 | 100 | 1.4 | -1.4 |

FIG. 15

| ELAPSED TIME [hour] | THRESHOLD VOLTAGE (Vth_high) OF MEMORY CELL [V] | THRESHOLD VOLTAGE (Vth_low) OF MEMORY CELL [V] |
|---|---|---|
| 1000000 | -1.8 | 1.8 |
| 215444 | -1.3 | 1.3 |
| 46416 | -0.7 | 0.7 |
| 10000 | -0.2 | 0.2 |
| 2154 | 0.3 | -0.3 |
| 464 | 0.9 | -0.9 |
| 100 | 1.4 | -1.4 |

STORAGE DEVICE AND METHOD FOR MANAGING STORAGE DEVICE

CROSS-REFERENCE TO RELATED APPLICATIONS

The disclosure of Japanese Patent Application No. 2016-178194 filed on Sep. 13, 2016 including the specification, drawings and abstract is incorporated herein by reference in its entirety.

BACKGROUND

The present invention relates to a storage device and a method for managing the storage device.

In a flash memory, each level of a threshold voltage (Vth) of a transistor is set in correspondence with data such as 0 or 1 and so forth. In addition, in the flash memory, desirable data is stored by injecting electric charges into a trap layer (also called a floating gate) which is installed in a gate part of the transistor and thereby manipulating the threshold voltage. However, the amount of electric charges stored in the trap layer is decreased at various speeds by factors such as passage of time, an environment, a rewriting frequency and so forth. Accordingly, it is difficult to grasp the current amount of electric charges and there is a risk that stored data may be erroneously read out.

Therefore, a technology of managing a data holding period (also called a retention period) is proposed. For example, Japanese Unexamined Patent Application Publication No. 2000-11670 discloses equipment which has a timer for measuring a time elapsed after a writing operation has been executed on a nonvolatile memory and a refresh circuit which executes the writing operation again on the nonvolatile memory when the elapsed time which is measured by the timer has exceeded a predetermined time.

SUMMARY

However, in management of the retention period described in Japanese Unexamined Patent Application Publication No. 2000-11670, installation of a timer circuit is requested. In addition, when this timer circuit is not a timer (for example, an RTC (Real Time Clock) which does not depend on a power source, the accuracy of correction using the timer circuit depends on the state of the power source. The management of the retention period which is described in Japanese Unexamined Patent Application Publication No. 2000-11670 has such a disadvantage that it is requested to install the timer circuit such as the RTC and so forth in this way.

Other matters to be solved and novel features of the preset invention will become apparent from the description of the present specification and the appended drawings.

The present invention has been made in view of the above mentioned circumstances. According to one embodiment of the present invention, there is provided a storage device which includes a plurality of flash memory cells, a control unit and an estimation unit which estimates the current threshold voltage of one memory cell on the basis of the current threshold voltage of another cell for decision.

According to the above-mentioned one embodiment of the present invention, it is possible to manage the threshold voltage of the flash memory cell with no installation of the timer circuit.

BRIEF DESCRIPTION OF THE DRAWINGS

FIG. 15 is a table illustrating one example of a table of the retention characteristic of the memory cell to be stored into the database.

DETAILED DESCRIPTION

For clarification of the explanation, the following description and drawings are appropriately omitted and simplified. In the respective drawings, the same symbols are assigned to the same elements and duplicated description thereof is omitted as requested.

Prior to description of the embodiments, first, a transition of a threshold voltage (Vth) of a transistor in a flash memory will be described. In the flash memory, the threshold voltage is adjusted to a value corresponding to data to be stored by adjusting an amount of electric charges in a trap layer of the transistor which configures a cell. For example, when a first value (for example, 1) is to be stored as the data, the threshold voltage is set such that the threshold voltage has a first predetermined value (referred to as Vth_low), and when a second value (for example, 0) is to be stored as the data, the threshold voltage is set such that the threshold voltage has a second predetermined value (referred to as Vth_high). Incidentally, here, Vth_low<Vth_high is defined. In the following, storage data which corresponds to a lower threshold voltage in two threshold voltages which would be set when storing the first value as the data will be referred to as Low-side data. In addition, storage data which corresponds to a higher threshold voltage in two threshold voltages which would be set when storing the second value as the data will be referred to as High-side data.

Figure 1:
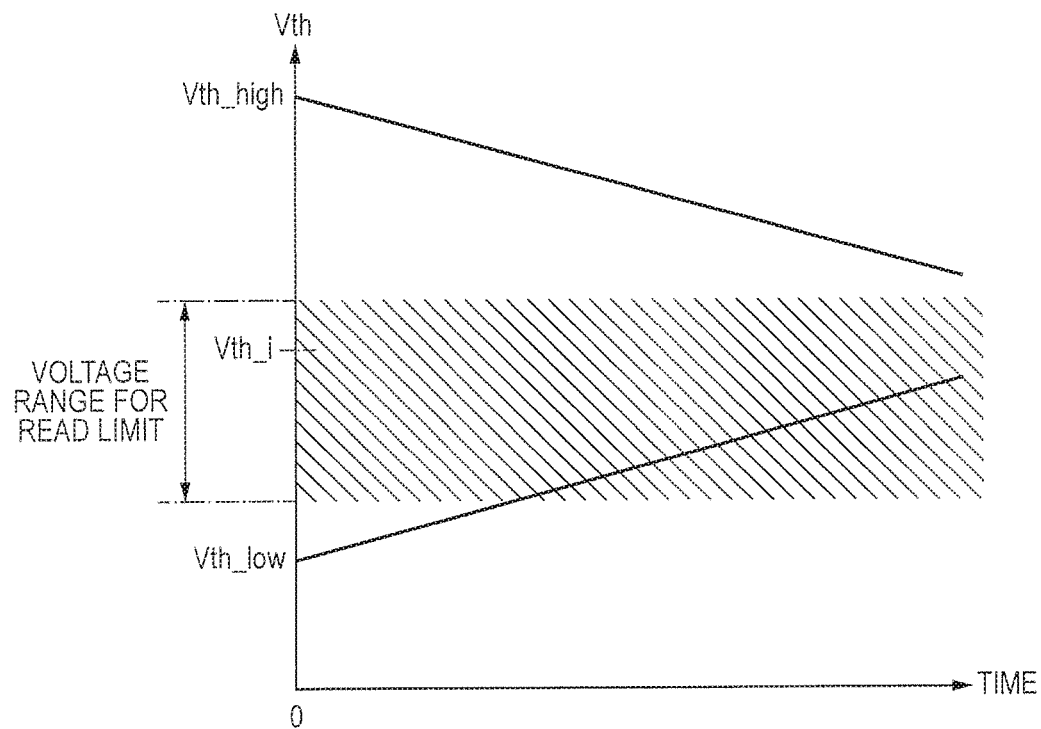
FIG. 1 is a graph illustrating one example of a retention characteristic of a flash memory cell.

FIG. 1 is a graph illustrating one example of a retention characteristic of the flash memory cell. That is, FIG. 1 illustrates a time transition of the threshold voltage. Even when a rewriting process has been performed and the threshold voltage has been set at a time 0, the threshold voltage does not maintain a fixed value and changes with time as illustrated in FIG. 1. When an inherent threshold voltage (referred to as Vth_i) which is determined depending on the amount of electric charges injected in formation of the transistor, a structure of the transistor and so forth has a voltage value between Vth_low and Vth_high as illustrated in FIG. 1, the threshold voltage which has been set when rewriting would converge to Vth_i. Describing in more detail, the threshold voltage which has been set when rewriting for storing the High-side data has been performed gradually decreases with time and the threshold voltage which has been set when rewriting for storing the Low-side data has been performed gradually increases with time. Then, the threshold voltage rushes into a voltage range within which correct data reading is not ensured. In the following, this voltage range will be referred to as a voltage range for read limit.

In the voltage range for read limit, read data becomes indefinite due to an operational limit of a circuit used for a reading process. Therefore, it is no ensured to correctly perform data reading. Describing in more detail, although the threshold voltage which has been set in the transistor is decided on the basis of a current value obtained when a predetermined voltage has been applied to the transistor, when the threshold voltage rushes into the voltage range for read limit, a result of decision on the basis of the current value is not uniquely determined. For example, in a single-type flash memory, a difference between a value of current flowing through the transistor and a reference current value is amplified by an amplifier. However, when the threshold voltage is in the above-mentioned voltage range, since the difference between the value of the current flowing through the transistor and the reference current value is too small, the amplifier does not correctly function and the value of the read data becomes indefinite. Likewise, in a complementary flash memory, a difference between a value of current flowing through one transistor and a value of current flowing through the other transistor is amplified by the amplifier. However, when the threshold voltage is in the above-mentioned voltage range, since the difference is too small, the amplifier does not correctly function and the value of the read data becomes indefinite. That is, the voltage range for read limit is a threshold voltage range within which the current of the level at which the value of the read data is not uniquely determined flows through the transistor. In other words, the voltage range for read limit is a voltage range within which the read data of the memory cell becomes indefinite. Incidentally, an upper limit and a lower limit in the voltage range are determined depending on the characteristic of the circuit used for the reading process and have values which have been already known at designing and manufacturing stages.

Incidentally, the single-type flash memory is a flash memory that one bit is stored by one transistor. The complementary flash memory is a flash memory that one bit is stored by two transistors. In the complementary flash memory, when 1 is to be stored, the threshold voltage of a first transistor is set to Vth_low and the threshold voltage of a second transistor is set to Vth_high. On the other hand, when 0 is to be stored, the threshold voltage of the first transistor is set to Vth_high and the threshold voltage of the second transistor is set to Vth_low.

First Embodiment

Figure 2:
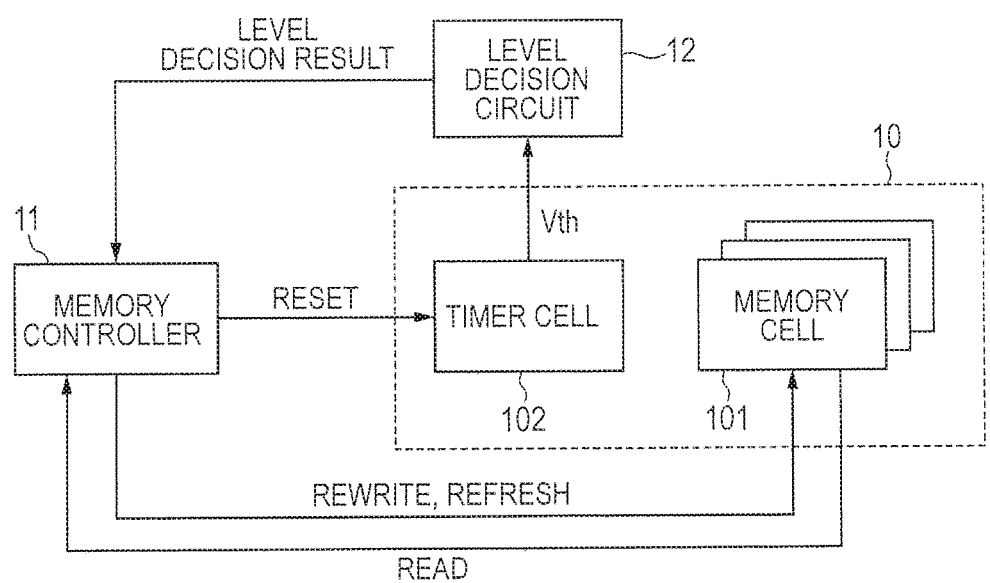
FIG. 2 is a block diagram illustrating one example of a configuration of a storage device according to a first embodiment.

Next, the first embodiment will be described. FIG. 2 is a block diagram illustrating one example of a configuration of a storage device 1 according to the first embodiment. As illustrated in FIG. 2, the storage device 1 includes a plurality of flash memory cells 10, a memory controller 11, a level decision circuit 12 and so forth.

The flash memory cell 10 is configured by a MOS transistor which stores data by changing the amount of the electric charges in the trap layer and thereby controlling the threshold voltage. That is, the flash memory cell 10 is configured by a transistor which is called, for example, a floating gate MOS transistor and so forth. In the first embodiment, the plurality of flash memory cells 10 are divided into memory cells 101 and timer cells 102. In the first embodiment, one or more memory cell(s) 101 and one timer cell 102 are included as illustrated in FIG. 2 by way of example. The memory cell 101 and the timer cell 102 are cells which exhibit similar characteristics for a change in threshold voltage. That is, the memory cell 101 and the timer cell 102 are similar to each other in threshold voltage change characteristic for factors which change the threshold voltage. In other words, there is a correlation between the threshold voltage change characteristic of the memory cell 101 and the threshold voltage change characteristic of the timer cell 102. As one example, a case where the memory cell 101 and the timer cell 102 are cells having the same configuration may be given.

The memory cell 101 is the cell which is used as the cell for storing data in the plurality of flash memory cells 10. In addition, the timer cell 102 is the cell which is used for decision of the threshold voltage of the memory cell 101 in the plurality of flash memory cells 10. The timer cell 102 is also referred to as a cell for decision.

The memory controller 11 is an electronic circuit which controls the flash memory cells 10. Incidentally, the memory controller 11 is also referred to as a control unit. The memory controller 11 performs a process of reading data which is stored in the memory cell 101, a process of rewriting data to the memory cell 101 and a process of refreshing the memory cell 101. In addition, the memory controller 11 also performs a resetting process which is the process of setting the threshold voltage of the timer cell 102 to a predetermined initial value. Here, the memory controller 11 writes the data into the memory cell 101 and performs the process of resetting the timer cell 102, that is, resetting of the threshold value of the timer cell 102 when data writing. In the first embodiment, the storage device 1 includes one timer cell 102 and the memory controller 11 performs the process of resetting the timer cell 102 when firstly writing data into any one of the plurality of memory cells 101 and thereafter performs the process of resetting the timer cell 102 every time the refreshing process is performed when reading data out of any one of the memory cells 101.

The level decision circuit 12 is an electronic circuit which acquires the current threshold value of the timer cell 102 and decides (estimates) the state of the current threshold voltage of the memory cell 101 on the basis of the acquired threshold voltage. Incidentally, the level decision circuit 12 is also referred to as an estimation unit. The level decision circuit 12 fluctuates, for example, the voltage which is applied to the timer cell 102 and acquires the threshold voltage by measuring the voltage when the current of a predetermined current value has flown into the timer cell 102. As described above, the timer cell 102 has a characteristic which is similar to that of the memory cell 101 for the change in threshold voltage. Accordingly, it is possible to grasp to what extent the current threshold voltage of the memory cell 101 changes after the data has been written by checking out the current threshold voltage of the timer cell 102 on which the resetting process has been performed when writing data into the memory cell 101.

Figure 3:
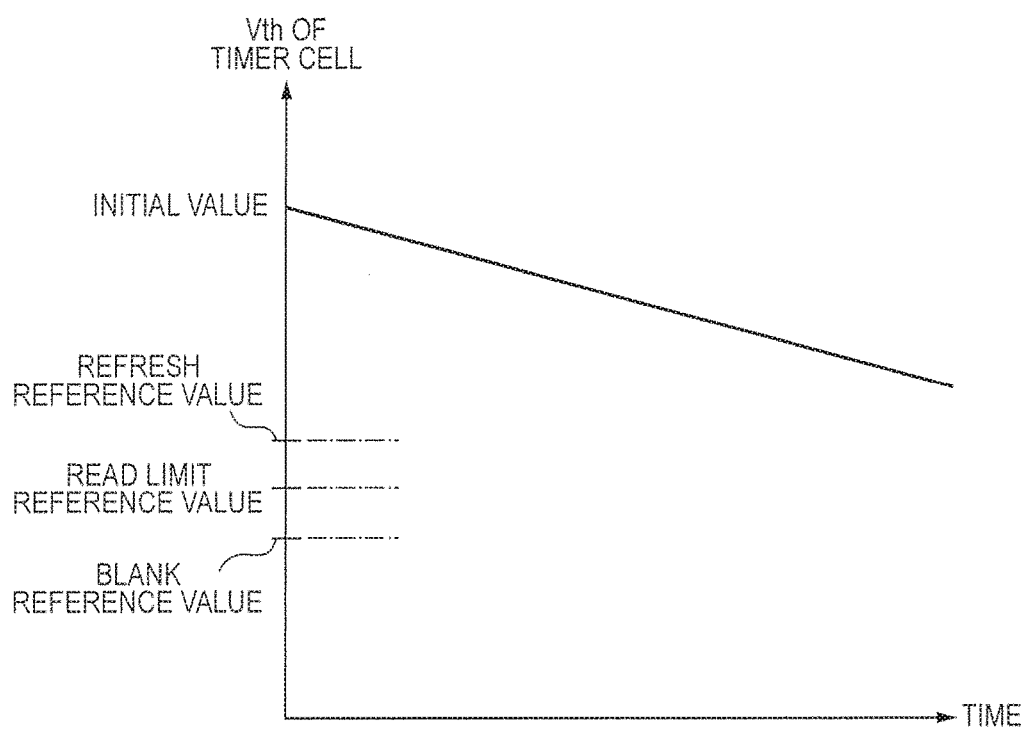
FIG. 3 is a graph illustrating one concrete example of a retention characteristic of a timer cell.

FIG. 3 is a graph illustrating one concrete example of a retention characteristic of the timer cell 102. In FIG. 3, the vertical axis indicates a value of the threshold voltage of the timer cell 102 and the horizontal axis indicates a time elapsed after the threshold voltage of the timer cell 102 has been set to the initial value. As apparent from FIG. 3, it is possible to grasp the time elapsed after the threshold voltage of the timer cell 102 has been set to the initial value by measuring the threshold voltage of the timer cell 102. Here, when setting of the threshold voltage for data storage into the memory cell 101 is performed, the timer cell 102 is reset and the threshold voltage of the timer cell 102 is set to the initial value. Accordingly, it is possible to grasp a time elapsed after the threshold voltage of the memory cell 101 has been set for data storage from a measured value of the threshold voltage of the timer cell 102.

This means that it is possible to grasp to what extent the threshold value of the memory cell 101 fluctuates after it has been set. For example, in a case of such a retention characteristic (the retention characteristic illustrated in FIG. 3) that the threshold voltage of the timer cell 102 decreases with time, it is possible to presume an amount of fluctuation in the threshold voltage of the memory cell 101 after it has been set by deciding to what extent the threshold voltage of the timer cell 102 decreases from the initial value. Therefore, the level decision circuit 12 estimates the state of the current threshold voltage of the memory cell 101 by comparing the current threshold voltage of the timer cell 102 with a reference value which has been defined in advance.

The initial value of the timer cell 102 is, for example, an optional predetermined value which is higher than an upper-limit voltage value in the voltage range for read limit of the memory cell 101 or an optional predetermined value which is lower than a lower-limit voltage value in the voltage range for read limit of the memory cell 101. However, it is preferable that the retention characteristic of the timer cell 102 be longer in retention period than the retention characteristic of the memory cell 101. That is, it is preferable that a time taken from when the threshold voltage of the timer cell 102 has been set to the initial value to when the threshold voltage of the timer cell 102 rushes into the voltage range for read limit be longer than a time taken from when the threshold voltage of the memory cell 101 has been set to when the threshold voltage of the memory cell 101 rushes into the voltage range for read limit. This is because when the threshold voltage of the timer cell 102 reaches the voltage range for read limit, it is feared that measurement of the threshold voltage of the timer cell 102 may not be performed normally. That is, a period for which it is possible to estimate the state of the memory cell 101 is limited. It is possible to prevent the period from being limited by making the retention characteristic of the timer cell 102 longer in retention period than the retention characteristic of the memory cell 101.

The level decision circuit 12 estimates the state of the current threshold voltage of the memory cell 101 concretely as follows. First, one example of an operation performed when the initial value of the threshold voltage of the timer cell 102 is higher than the upper-limit voltage value of the voltage range for read limit of the memory cell 101 will be described. That is, the example of the operation performed when the threshold voltage of the timer cell 102 is set to the predetermined initial value which is higher than the upper-limit voltage value in the voltage range for read limit of the memory cell 101 in the resetting process to be performed by the memory controller 11 will be described. In this case, since Vth_i of the timer cell 102 is present in the voltage range for read limit, the threshold voltage of the timer cell 102 decreases with time as illustrated in FIG. 3. Accordingly, when the measured value of the threshold voltage of the timer cell 102 is lower than a refresh reference value (see FIG. 3) which is a predetermined value lower than the initial value, the level decision circuit 12 estimates that the memory cell 101 is in a state where refreshing is required. In addition, when the threshold voltage of the timer cell 102 is lower than a read limit reference value (see FIG. 3) which is a predetermined value lower than the refresh reference value, the level decision circuit 12 estimates that the memory cell 101 is in a state where the read data becomes indefinite. That is, the level decision circuit 12 estimates that the threshold value of the memory cell 101 rushes into the voltage range for read limit. In addition, the level decision circuit 12 may perform further estimation. For example, when the threshold voltage of the timer cell 102 is lower than a blank reference value (see FIG. 3) which is a predetermined value lower than the read limit reference value, the level decision circuit 12 may estimate that the memory cell 101 is in a state where data is not stored in the memory cell 101.

Next, one example of an operation performed when the initial value of the threshold voltage of the timer cell 102 is lower than the lower-limit voltage value in the voltage range for read limit of the memory cell 101 will be described. That is, the example of the operation performed when the threshold voltage of the timer cell 102 is set to the predetermined initial value which is lower than the lower-limit voltage value in the voltage range for read limit of the memory cell 101 in the resetting process performed by the memory controller 11 will be described. In this case, since Vth_i of the timer cell 102 is present in the voltage range for read limit, the threshold voltage of the timer cell 102 increases with time contrary to the example illustrated in FIG. 3. Therefore, when the measured value of the threshold voltage of the timer cell 102 is higher than the refresh reference value which is the predetermined value higher than the initial value, the level decision circuit 12 estimates that the memory cell 101 is in the state where refreshing is required. In addition, when the threshold voltage of the timer cell 102 is higher than the read limit reference value which is the predetermined value higher than the refresh reference value, the level decision circuit 12 estimates that the memory cell 101 is in the state where the read data becomes indefinite. That is, the level decision circuit 12 estimates that the threshold voltage of the memory cell 101 rushes into the voltage range for read limit. In addition, the level decision circuit 12 may perform further estimation. For example, when the threshold voltage of the timer cell 102 is higher than the blank reference value which is the predetermined value higher than the read limit reference value, the level decision circuit 12 may estimate that data is not stored in the memory cell 101.

When it has been estimated by the level decision circuit 12 that the memory cell 101 is in the state where refreshing is required, the memory controller 11 executes the refreshing process on the memory cell 101. That is, the memory controller 11 acquires the read data by performing a reading process on the memory cell 101 and writes the data which is the same as the read data again into the memory cell 101. Consequently, the threshold voltage is recovered and thereby it becomes possible to make the retention period long. However, when the threshold voltage of the memory cell 101 is in the voltage range for read limit, it is feared that overwriting using the data which has been originally stored in the memory cell 101 may not be performed when refreshing. Accordingly, in the first embodiment, when it has been estimated by the level decision circuit 12 that the memory cell 101 is in the state where refreshing is required and it has been also estimated that the memory cell 101 is not in the state where the read data of the memory cell 101 becomes indefinite, the memory controller 11 executes the refreshing process on the memory cell 101. Thereby, it becomes possible to prevent the storage data from being updated with wrong data by the refreshing process.

Figure 4:
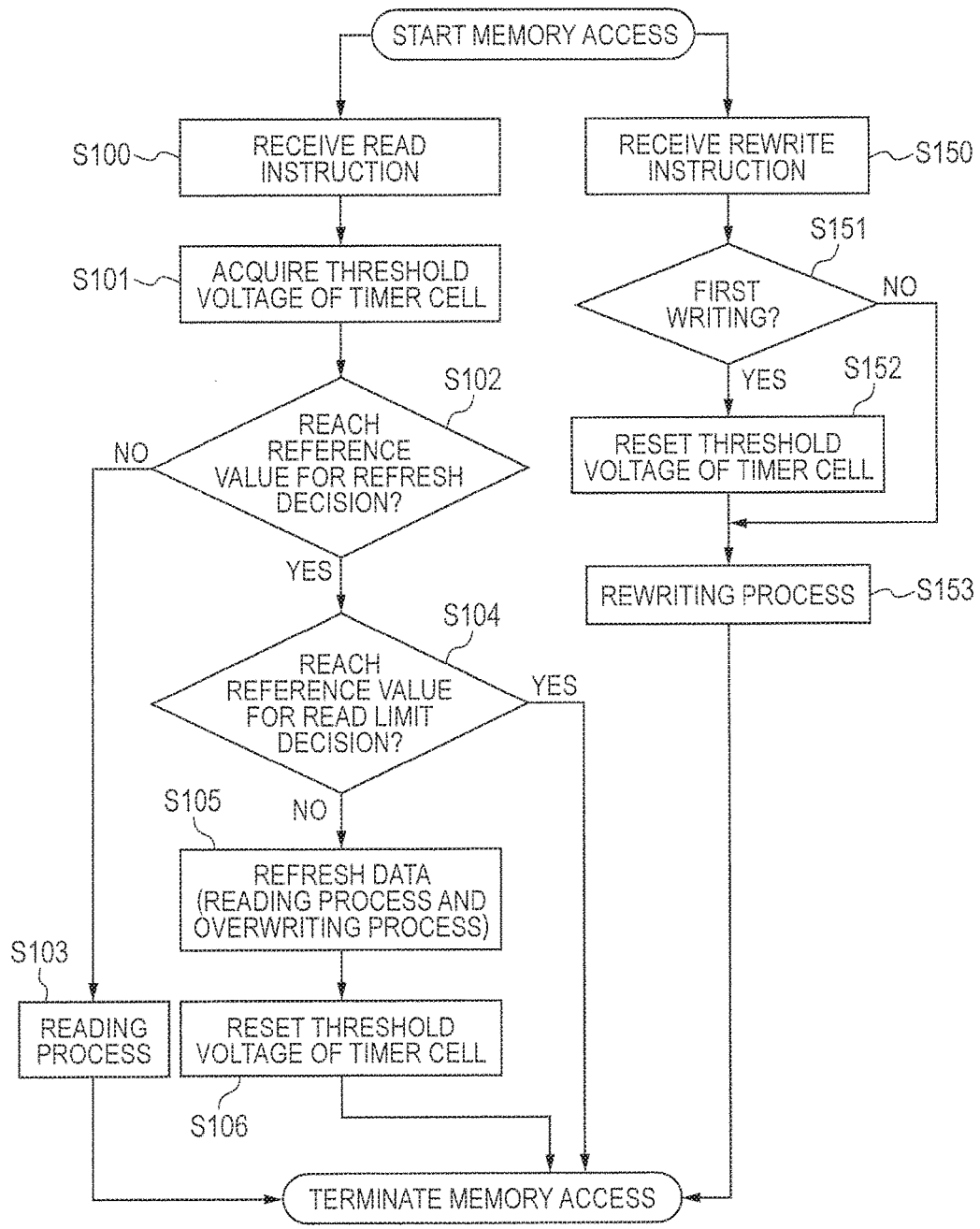
FIG. 4 is a flowchart illustrating one example of an operation of the storage device according to the first embodiment.

Next, one example of an operation of the storage device 1 according to the first embodiment will be described. FIG. 4 is a flowchart illustrating one example of the operation of the storage device 1 according to the first embodiment. In the following, one example of the operation performed by the storage device 1 when data reading will be described first.

In step 100 (S100), the storage device 1 receives a read instruction from another device and so forth. Next, in step 101 (S101), the level decision circuit 12 acquires the current threshold voltage of the timer cell 102. Then, in step 102 (S102), the level decision circuit 12 decides whether the acquired threshold voltage reaches the refresh reference value. When it has been decided that the threshold voltage does not reach the refresh reference value, the process proceeds to step 103 (S103), while when it has been decided that the threshold voltage reaches the refresh reference value, the process proceeds to step 104 (S104). In step 103 (S103), since the state of the threshold voltage of the memory cell 101 is at a normal level, the memory controller 11 performs the reading process.

On the other hand, in step 104 (S104), the level decision circuit 12 decides whether the acquired threshold voltage reaches the read limit reference value. When it has been decided that the threshold voltage reaches the read limit reference value, it is not allowed to properly read out the read data and therefore a memory accessing process is terminated. When it has been decided that the threshold voltage does not reach the read limit reference value, the process proceeds to step 105 (S105).

In step 105 (S105), the memory controller 11 performs the refreshing process in addition to the reading process. That is, the memory controller 11 performs the reading process and an overwriting process using the read data on the memory cell 101. Then, the process proceeds to step 106 (S106). In step 106 (S106), the memory controller performs the process of resetting the threshold voltage of the timer cell 102.

In the foregoing, the example of the operation performed when data reading has been described. Next, one example of an operation performed when data rewriting will be described.

In step 150 (S150), the storage device 1 receives a rewrite instruction from another device and so forth. Next, in step 151 (S151), the memory controller 11 decides whether it is first data writing into the memory cell 101, that is, whether it is the first data writing in the storage device 1. When it is the first data writing, the process proceeds to step 152 (S152). When it is second or later data writing, the process proceeds to step 153 (S153). In step 152 (S152), the memory controller 11 performs the resetting process on the timer cell 102 and sets the threshold voltage of the timer cell 102 to the initial value. In step 153 (S153), the memory controller 11 performs the data rewriting process on the memory cell 101.

In the foregoing, the storage device 1 according to the first embodiment has been described. According to the storage device 1 pertaining to the first embodiment, it is possible to estimate the current state of the memory cell 101 from the state of the timer cell 102. Therefore, it is possible to manage the flash memory cells with no installation of the timer circuit. In addition, since the threshold voltage of the timer cell 102 changes similarly to that of the memory cell 101 irrespective of presence/absence of a power source, it is possible to avoid the disadvantage that it is requested to use the RTC when managing the elapsed time by the timer circuit. Incidentally, since in the first embodiment, the threshold voltage of the memory cell 101 is not directly detected, there is such an advantageous effect as follows. That is, when the threshold voltage of the memory cell 101 is to be directly detected, the threshold voltage is detected by applying a voltage to the memory cell 101 and sweeping a gate voltage. However, in this case, it is feared that an influence may be exerted on retained electric charges of other cells with which the memory cell 101 shares a bias line while detection is being made and thereby data may be modified. In the first embodiment, since the threshold voltage of the memory cell 101 is not directly detected and is estimated from the threshold voltage of the timer cell 102, it is possible to avoid occurrence of such a disadvantage as mentioned above. In addition, there is also such an advantage that it is possible to more reduce a time taken for detection by detecting only the threshold voltage of one timer cell 102 which has been installed in correspondence with the plurality of memory cells 101 than by detecting the threshold voltages of the plurality of memory cells 101 one by one. In addition, when the storage device 1 is designed such that there exists the bias line which is shared between the timer cell 102 and the memory cells 101, a reduction in time taken for detection leads to a reduction in stress imposed on the memory cells 101 in detection. That is, it becomes possible to suppress modification of the data in the memory cells 101.

Incidentally, in the first embodiment, the configurational example in the case where one timer cell 102 is installed has been described. However, the plurality of timer cells 102 may be installed. For example, the timer cell 102 may be installed for every memory cell group (a memory block) which is the rewrite unit. In such a case, although it is requested to additionally prepare an area for installation of the timer cells 102, it is possible to reduce the redundant refreshing process. That is, when the timer cell 102 which is shared among the plurality of memory blocks is utilized, the refreshing process is performed in accordance with the state of the threshold voltage of the memory block which is the earliest in data writing timing and therefore it is feared that the refreshing process may be performed even in a case where it is not originally requested to perform the refreshing process. This disadvantage is improved by installing the timer cell 102 for every memory block. Incidentally, when the timer cell 102 is installed for every memory block, the memory controller 11 performs the resetting process on the timer cell 102 which corresponds to the memory block as a data rewiring object every time the rewriting process is executed regardless of whether it is the first data rewriting in the above-mentioned operational example. In addition, the timer cell 10 may be installed not for every memory block but for every predetermined number of memory blocks.

Second Embodiment

Next, the second embodiment will be described. In the storage device 1 according to the first embodiment, when it has been estimated that the threshold voltage of the memory cell 101 rushes into the voltage range for read limit, the reading process is not performed. In contrast, in the second embodiment, a storage device which is capable of acquiring the read data even when it is estimated that the threshold voltage of the memory cell 101 rushes into the voltage range for read limit will be described.

Figure 5:
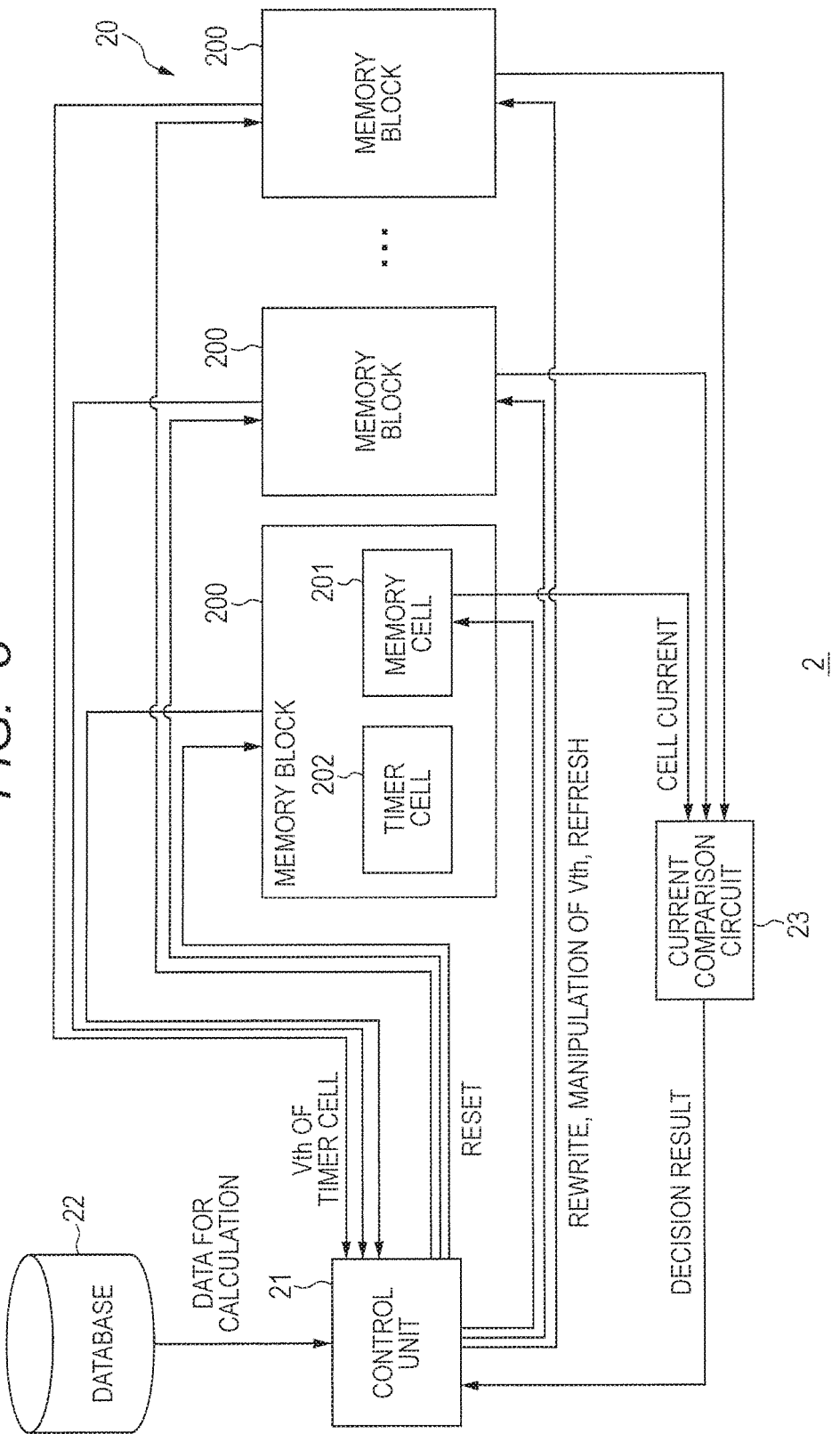
FIG. 5 is a block diagram illustrating one example of a configuration of a storage device according to a second embodiment.

FIG. 5 is a block diagram illustrating one example of a configuration of a storage device 2 according to the second embodiment. As illustrated in FIG. 5, the storage device 2 includes a plurality of flash memory cells 20, a control unit 21, a database 22, a current comparison circuit 23 and so forth.

As illustrated in FIG. 5, the plurality of flash memory cells 20 configure a memory block 200 for every rewrite unit. The memory block 200 includes one or more memory cell(s) 201 and one timer cell 202. That is, in the second embodiment, the timer cell 202 is installed for every memory cell group which is the rewrite unit, that is, for every memory block. Incidentally, although in the second embodiment, the timer cell 202 is installed for every memory block by way of example, one timer cell 202 may be installed for the storage device 2 or/and the timer cell 202 may be installed for every predetermined number of memory blocks. Since the memory cell 201 is the same as the memory cell 101 in the first embodiment and the timer cell 202 is the same as the timer cell 102 in the first embodiment, concrete description thereof is omitted.

The control unit 21 is an electronic circuit which includes a memory controller, a CUP (Central Processing Unit) and so forth. The control unit 21 performs the process of reading the data stored in the memory cell 201, the process of rewriting data into the memory cell 201 and the process of refreshing the memory cell 201 similarly to the above-mentioned memory controller 11. Incidentally, the control unit 21 writes the data into the memory cell 201 in the memory block 200 and performs the process of resetting the timer cell 202 in the memory block 200 when data writing.

In addition, the control unit 21 performs the resetting process on the timer cell 202 similarly to the above-mentioned memory controller 11. In addition, the control unit 21 performs a threshold voltage changing process for manipulating the threshold voltage of the memory cell 201. Incidentally, details of the threshold voltage changing process will be described later. In addition, the control unit 21 acquires the current threshold voltage of the timer cell 202 and estimates the voltage value of the current threshold voltage of the memory cell 201 on the basis of the acquired threshold voltage of the timer cell 202 and information in the database 22. In functional configurations of the control unit 21, a functional configuration which performs this estimating process will be also referred to as an estimation unit.

The database 22 is a storage unit which provides data used for calculations to the control unit 21 and is configured by a memory such as, for example, a nonvolatile memory and so forth. Specifically, the database 22 stores therein a correspondence relation between a representative retention characteristic of the timer cell 202 and a representative retention characteristic of the memory cell 201. In addition, the database 22 also stores therein a voltage value change characteristic of the threshold voltage for the process of changing the threshold voltage of the memory cell 201. The control unit 21 performs the threshold voltage changing process for changing the threshold voltage by a desirable voltage value with reference to this change characteristic.

The current comparison circuit 23 compares a current value obtained when a predetermined voltage has been applied to the memory cell 201 with a predetermined value. When the storage device 2 is the single-type flash memory, the current comparison circuit 23 compares the current value obtained when the predetermined voltage has been applied to the transistor with the predetermined value and decides whether the current of a value which is at least this predetermined value flows through the transistor. In addition, in a case where the storage device 2 is the complementary flash memory, the current comparison circuit 23 compares a value of current flowing through one of the transistors with a value of current flowing through the other transistor when the predetermined voltage has been applied to the transistors and decides through which transistor more current flows. The control unit 21 reads out data stored in the memory cell 201 by acquiring a result of comparison by the current comparison circuit 23.

Figure 6:
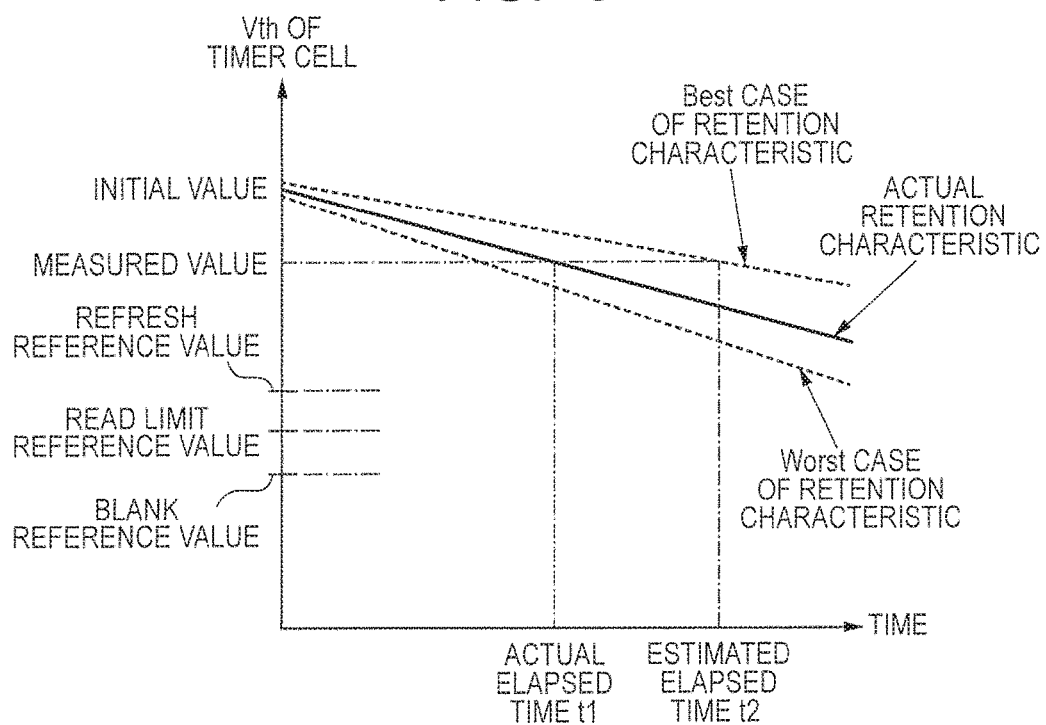
FIG. 6 is a graph illustrating one concrete example of the retention characteristic of the timer cell.

Next, an estimating process by the control unit 21 will be described in detail. The control unit 21 implements the estimating process, for example, by executing a program by the CPU. FIG. 6 is a graph illustrating one concrete example of the retention characteristic of the timer cell 202. Similarly to FIG. 3, in FIG. 6, the vertical axis indicates the value of the threshold voltage of the timer cell 202 and the horizontal axis indicates the time elapsed after the threshold voltage of the timer cell 202 has been set to the initial value. Time transition using the timer cell 202 will be described with reference to FIG. 6. When the retention characteristic of the timer cell 202 is known in advance, the time elapsed after the threshold voltage has been set to the initial value is specified from a measured value of the threshold voltage of the timer cell 202. However, as illustrated in FIG. 6, the elapsed time which is estimated varies depending on which retention characteristic is used for estimation as the retention characteristic of the timer cell 202. When the elapsed time is underestimated, it is feared that a situation that the threshold voltage which has been set to the memory cell 201 is in a state of having rushed into the voltage range for read limit or in a state of being about to rush into the voltage range for read limit may be overlooked. Although the retention characteristic of the timer cell 202 varies depending on environmental conditions such as a temperature and so forth, an individual difference and so forth, a retention characteristic (see "Best CASE" in the drawing) which is assumed to be the best is used as the representative retention characteristic of the timer cell 202 in order to avoid suck overlooking in the second embodiment. Accordingly, as illustrated in FIG. 6, in the second embodiment, when the threshold voltage of the timer cell 202 is measured, not an actual elapsed time t1 but an elapsed time t2 is estimated. In the second embodiment, a degree of time-dependent change in threshold voltage that the retention characteristic of the timer cell 202 in the database 22 indicates is smaller than a degree of actual time-dependent change in threshold voltage of the timer cell 202 in this way.

Figure 7:
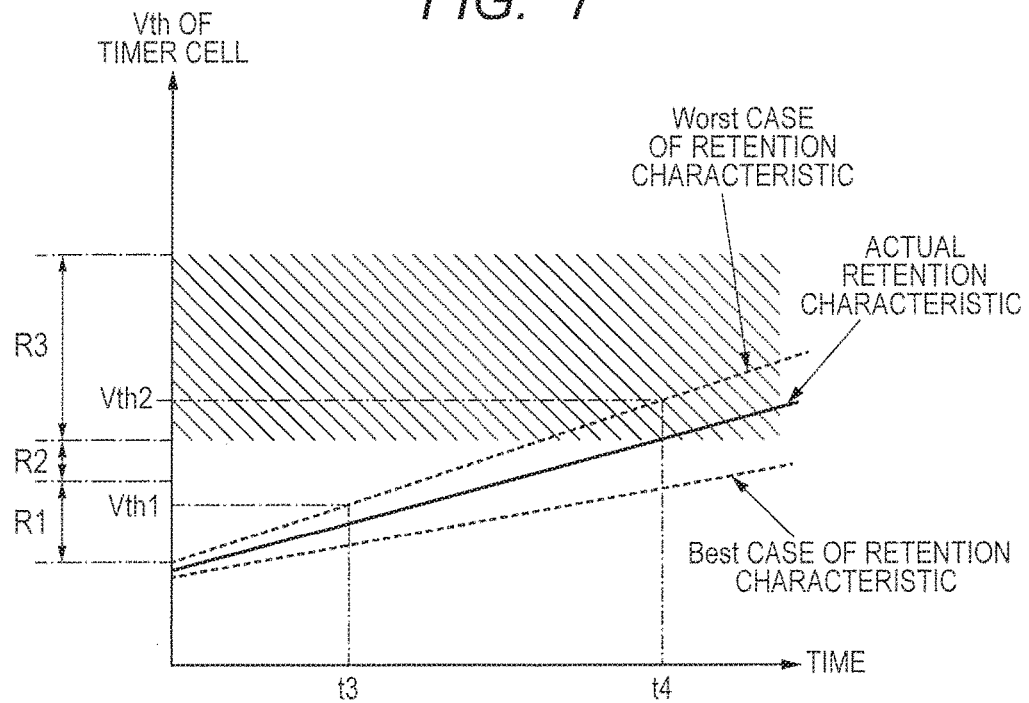
FIG. 7 is a graph illustrating one concrete example of the retention characteristic of the memory cell.

Next, estimation of the threshold voltage of the memory cell 201 will be described. FIG. 7 is a graph illustrating one concrete example of the retention characteristic of the memory cell 202. Incidentally, in FIG. 7, the retention characteristic obtained when the threshold voltage of the memory cell 201 has been set to Vth_low is illustrated. When setting of the threshold voltage of the timer cell 202 and setting of the threshold voltage of the memory cell 201 are performed at the same timing, it is possible to estimate the elapsed time from the measured value of the threshold voltage of the timer cell 202 as described above. In addition, as illustrated in FIG. 7, it is possible to estimate the voltage value of the threshold voltage of the memory cell 201 from the elapsed time. For example, when an estimated elapsed time is t3, Vth1 is estimated as the threshold voltage value of the memory cell 201. Likewise, when the estimated elapsed time is t4, Vth2 is estimated as the threshold voltage value of the memory cell 201.

Here, as illustrated in FIG. 7, the estimated threshold voltage varies depending on which retention characteristic is used as the retention characteristic of the memory cell 201 for estimation. When deterioration of the threshold voltage is underestimated, it is feared that the situation that the threshold voltage which has been set to the memory cell 201 is in the state of having rushed into the voltage range for read limit or in the state of being about to rush into the voltage range for read limit may be overlooked. Although also the retention characteristic of the memory cell 201 varies depending on the environmental conditions such as the temperature and so forth, the individual difference and so forth, in the second embodiment, a retention characteristic (see "Worst CASE" in the drawing) which is assumed to be the worst is used as the representative retention characteristic of the timer cell 202 in order to avoid suck overlooking as mentioned above. In the second embodiment, the degree of time-dependent change in threshold voltage that the retention characteristic of the memory cell 201 in the database 22 indicates is larger than the degree of actual time-dependent change in threshold voltage of the memory cell 201 in this way.

As described above, in the second embodiment, a margin is prepared for each of the retention characteristic of the timer cell 202 and the retention characteristic of the memory cell 201 which are used for estimation. Accordingly, it is possible to prevent rushing of the threshold voltage of the memory cell 201 into the voltage range for read limit from being overlooked.

The control unit 21 determines a process to be performed on the memory cell 201 when the read instruction has been received in accordance with the estimated threshold voltage of the memory cell 201. Specifically, when the estimated threshold voltage of the memory cell 201 does not reach the refresh reference value (see a voltage range R1 in FIG. 7), the control unit 21 performs the reading process on the memory cell 201, while when the estimated threshold voltage of the memory cell 201 reaches the refresh reference value (see a voltage rang R2 in FIG. 7), the control unit 21 performs the refreshing process on the memory cell 201 in addition to the reading process. In addition, when the estimated threshold voltage of the memory cell 201 further deteriorates and reaches the read limit reference value (see a voltage range R3 in FIG. 7), the control unit 21 performs the threshold voltage changing process on the memory cell 201.

Figures 8, 9:
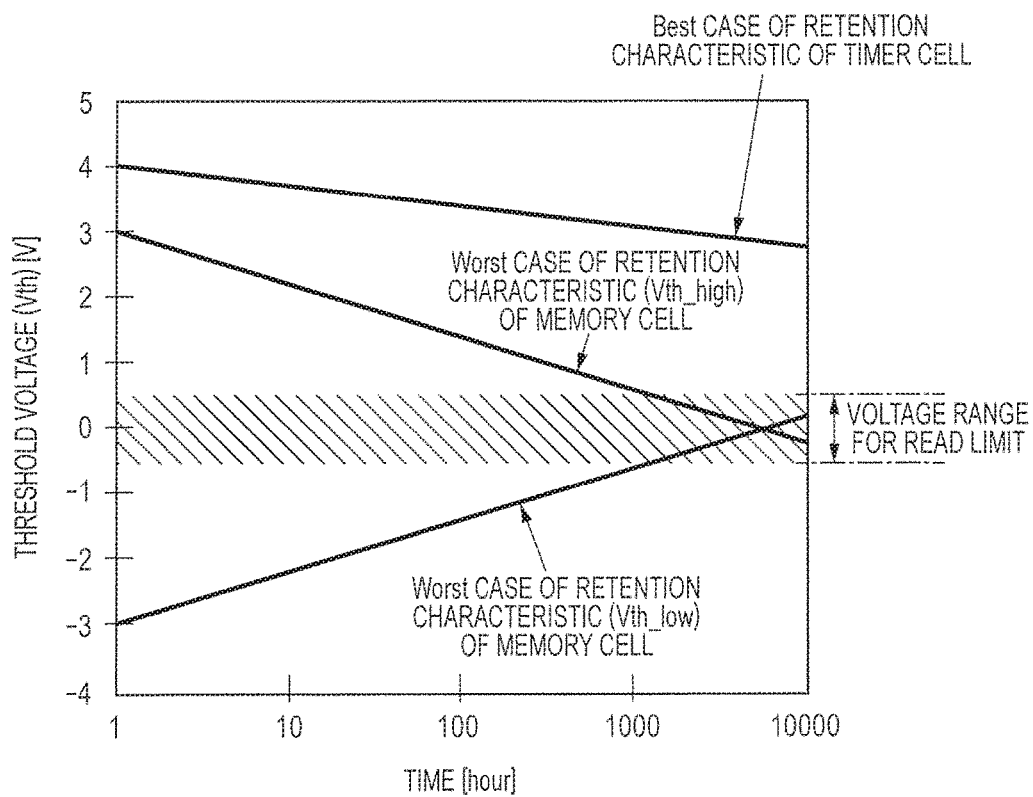
FIG. 8 is a graph illustrating one example of a correspondence relation among the retention characteristics to be stored into a database.
FIG. 9 is a table illustrating one example of a case where the correspondence relation illustrated in FIG. 8 is stored in the form of a table.

Next, the correspondence relation between the retention characteristic of the timer cell 202 and the retention characteristic of the memory cell 201 that the database 22 stores will be illustrated by using a concrete example. FIG. 8 is a graph illustrating one example of the correspondence relation between the retention characteristics which is stored in the database 22. In addition, FIG. 9 is a table illustrating one example of a case where the correspondence relation illustrated in FIG. 8 is stored in the form of a table. As illustrated in FIG. 9, the database 22 may store therein the table that the threshold voltage of the timer cell 202, the time elapsed after the threshold voltage has been set and the threshold voltage of the memory cell 201 have been set in correspondence with one another. In the table illustrated in FIG. 9, specifically, the voltage value of the timer cell 202 in the estimated best retention characteristic (the retention characteristic in "Best CASE"), the time elapsed after the threshold voltage has been set and the voltage values of the memory cell 201 in the estimated worst retention characteristic (the retention characteristic in "Worst CASE") are stored in correspondence with one another.

Incidentally, as described later, in the second embodiment, the control unit 21 determines the process to be performed in accordance with the threshold voltage which is set for storing Low-side data, that is, the estimated value of the threshold voltage which has been set to Vth_low when data writing. Accordingly, not both of the retention characteristic of the threshold voltage which is set for storing the Low-side data and the retention characteristic of the threshold voltage which is set for storing High-side data, but only the retention characteristic of the threshold voltage which is set for storing the Low-side data may be stored in the table as the representative retention characteristic of the memory cell 201. In addition, in the second embodiment, since it is enough as long as the estimated value of the threshold voltage of the memory cell 201 is found from the value of the threshold voltage of the timer cell 202, the elapsed time may not be stored in the table.

The database 22 may not necessarily store therein the correspondence relation among the values in the form of the table. It is possible to adopt an optional data format as the data format on the basis of which the database 22 stores the data therein. For example, when modeling of the retention characteristics is possible, arithmetic operation formulae used for calculating the threshold voltage of the memory cell 201 from the threshold voltage of the timer cell 202 may be stored in the database 22.

For example, it is assumed that the retention characteristic of the timer cell 202 in the best case is modeled with a function f as in the following formula (1). Likewise, it is assumed that the retention characteristic (the retention characteristic of the threshold voltage which is set for storing the Low-side data) of the memory cell 201 in the worst case is modeled with a function g as in the following formula (2) and the retention characteristic (the retention characteristic of the threshold voltage which is set for storing the High-side data) of the memory cell 201 in the worst case is modeled with a function h as in the following formula (3). Incidentally, in the formulae (1) to (3), $a_r$, $b_r$, ... $a_{MH}$, $b_{MH}$, ... and $a_{ML}$, $b_{ML}$ ... are parameters which are respectively determined by experimentation, simulation and so forth. In addition, t is a variable which indicates a time, $V_{thT}$ indicates the value of the current threshold voltage of the timer cell 202, $V_{thMH}$ indicates the value of the current threshold voltage of the memory cell 201 whose threshold voltage has been set to Vth_high, and $V_{thML}$ indicates the value of the current threshold voltage of the memory cell 201 whose threshold voltage has been set to Vth_low.

[Numerical Expression 1]

$$V_{thT} = f(a_T, b_T, \ldots, t) \quad (1)$$

[Numerical Expression 2]

$$V_{thMH} = g(a_{MH}, b_{MH}, \ldots, t) \quad (2)$$

[Numerical Expression 3]

$$V_{thML} = h(a_{ML}, b_{ML}, \ldots, t) \quad (3)$$

It is possible to calculate the threshold voltages $V_{thMH}$ and $V_{thML}$ of the memory cell 201 from the above-mentioned arithmetic expressions. The database 22 may store therein the above-mentioned arithmetic expressions in place of the table.

When the correspondence relation among the respective values is indicated by the table, it is possible to omit execution of numerical calculations when estimating the threshold voltage of the memory cell 201. For example, when it is difficult to model the arithmetic expressions (1) to (3) and so forth, the table is used. In addition, when the correspondence relation among the values is indicated by the arithmetic expressions, it is also possible to improve estimation accuracy by modeling the arithmetic expressions by adding parameters which indicate the rewriting frequency and so forth.

The control unit 21 estimates the current threshold voltage of the memory cell 201 from the current threshold voltage of the timer cell 202 by using the correspondence relation stored in the database 22 and decides whether the threshold voltage of the memory cell 201 reaches a voltage range within which it is requested to perform the refreshing process and whether the threshold voltage of the memory cell 201 reaches the voltage range for read limit. Therefore, it is possible to manage the threshold voltage of the flash memory cell 20 with no installation of the timer circuit. In the following, estimation and the threshold voltage changing process performed by the control unit 21 will be further described. In the second embodiment, the control unit 21 estimates the threshold voltage of the memory cell 201 as a data reading object from the threshold voltage of the timer cell 202 when data reading as described above. When it has been decided that the estimated value of the threshold voltage reaches the voltage range for read limit (see the voltage range R3 in FIG. 7), the control unit 21 performs the threshold voltage changing process on the memory cell 201 as the data reading object. In the threshold voltage changing process, the control unit 21 changes the threshold voltage of the memory cell 201 by a voltage value corresponding to a difference between the estimated value of the current threshold voltage of the memory ell 201 and a boundary value in the voltage range for read limit. Then, the control unit 21 acquires the read data of the memory cell 201.

In the following, the operation of the control unit 21 will be described in more detail. In the second embodiment, the control unit 21 operates as follows. First, when estimating the threshold voltage of the memory cell 201 as the data reading object, the control unit 21 estimates the value of the threshold voltage of the memory cell 201 on the assumption that the memory cell 201 as the data reading object is the memory cell in which the Low-side data has been stored. That is, the control unit 21 estimates the value of the current threshold voltage of the memory cell 201 obtained when the threshold voltage has been set to Vth_low.

When it has been decided that the estimated value of the threshold voltage reaches the voltage range for read limit, the control unit 21 performs the threshold voltage changing process on the memory cell 201 as follows. When the estimated value of the current threshold voltage of the memory cell 201 whose threshold voltage has been assumed to be set to Vth_low exceeds the lower limit value in the voltage range for read limit, the control unit 21 calculates a difference between the estimated value and the lower limit value. Then, the control unit 21 decreases the threshold voltage of the memory cell 201 by the voltage value corresponding to the difference with reference to the voltage value change characteristic stored in the database 22. That is, the control unit 21 performs an erasing process on the memory cell 201 by the amount corresponding to the difference. Then, the control unit 21 acquires a result of decision performed by the current comparison circuit 23. Description will be further made with respect to this point using the drawings.

Figure 10A:
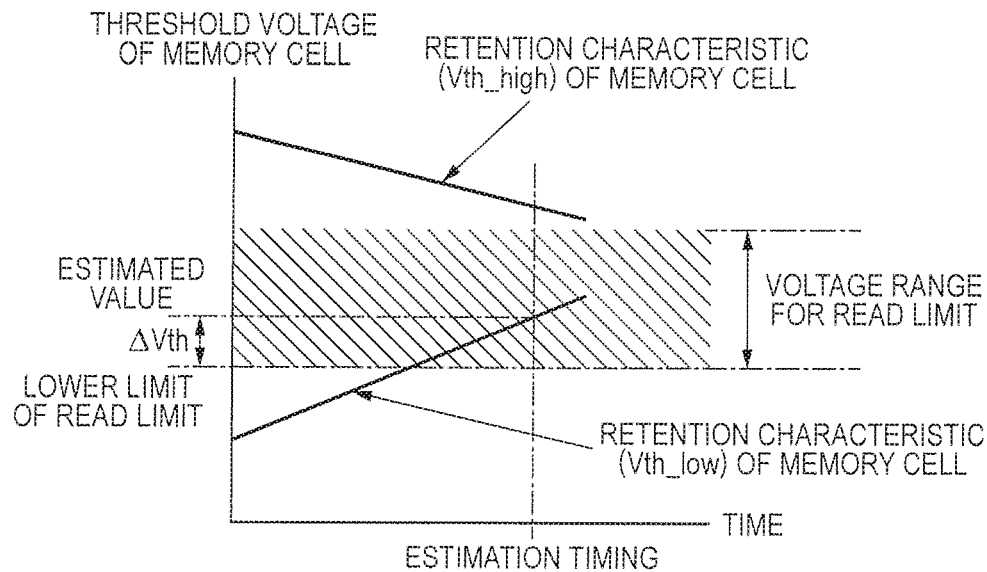
FIG. 10A is a graph illustrating one example of one state where read data of the memory cell becomes indefinite.
Figure 10B:
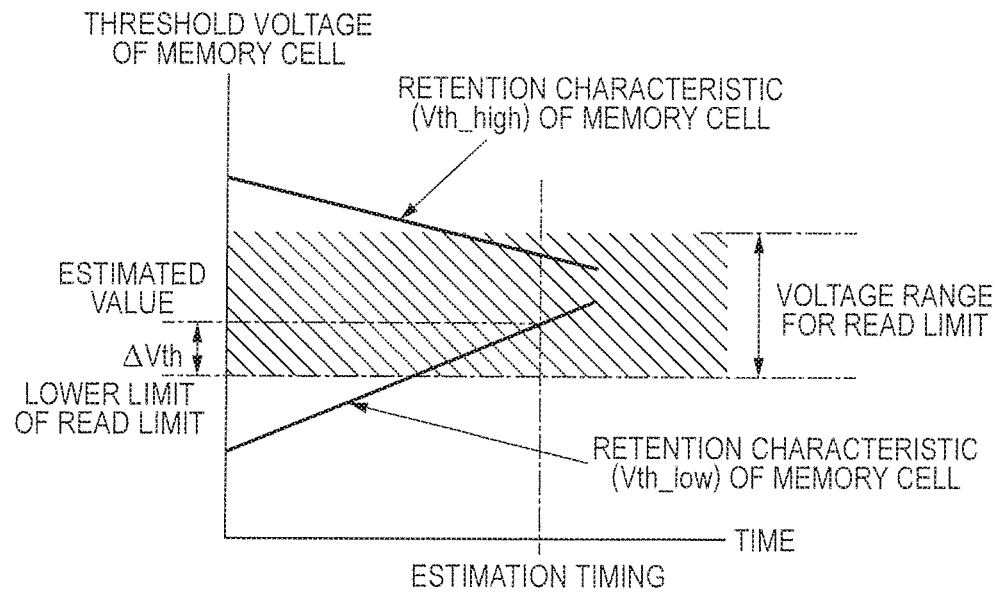
FIG. 10B is a graph illustrating one example of another state where the read data of the memory cell becomes indefinite.
Figure 10C:
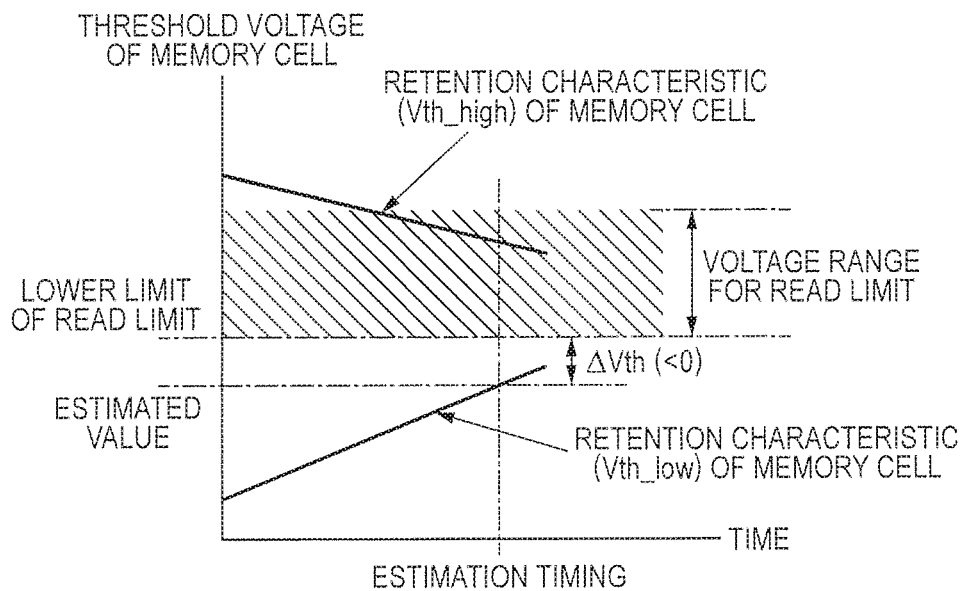
FIG. 10C is a graph illustrating one example of a further state where the read data of the memory cell becomes indefinite.

When data reading is performed before a timing that the retention characteristic of the memory cell 201 whose threshold voltage has been set to Vth_low intersects with the retention characteristic of the memory cell 201 whose threshold voltage has been set to Vth_high, three states illustrated in FIG. 10A to FIG. 10C are conceived as the states where the read data of the memory cell 201 becomes indefinite.

In the state illustrated in FIG. 10A, although the estimated value corresponding to the retention characteristic of the memory cell 201 whose threshold voltage has been set to Vth_low reaches the voltage range for read limit, the estimated value corresponding to the retention characteristic of the memory cell 201 whose threshold voltage has been set to Vth_high does not reach the voltage range for read limit. In this case, although when the High-side data is stored in the memory cell 201, it is possible to normally perform the reading process, when the Low-side data is stored in the memory cell 201, the read data would become indefinite. Incidentally, since in the second embodiment, the above-mentioned margins are prepared, the read data may not necessarily become indefinite and there is the possibility that the data may be read normally in reality.

In the state illustrated in FIG. 10B, both of the estimated value corresponding to the retention characteristic of the memory cell 201 whose threshold voltage has been set to Vth_low and the estimated value corresponding to the retention characteristic of the memory cell 201 whose threshold voltage has been set to Vth_high reach the voltage range for read limit. In this case, the read data would become indefinite when the High-side data is stored in the memory cell 201 and also when the Low-side data is stored in the memory cell 201. Incidentally, also in this case, since the above-mentioned margins are prepared, the read data may not necessarily become indefinite and there is the possibility that the data may be read normally in reality.

In the state illustrated in FIG. 10C, although the estimated value corresponding to the retention characteristic of the memory cell 201 whose threshold voltage has been set to Vth_low does not reach the voltage range for read limit, the estimated value corresponding to the retention characteristic of the memory cell 201 whose threshold voltage has been set to Vth_high reaches the voltage range for read limit. In this case, although when the Low-side data is stored in the memory cell 201, it is possible to normally perform the reading process, when the High-side data is stored in the memory cell 201, the read data would become indefinite. Incidentally, also in this case, since the above-mentioned margins are prepared, the read data may not necessarily become indefinite and there is the possibility that the data may be read normally in reality.

As described above, in the second embodiment, the control unit 21 acquires the estimated value of the current threshold voltage of the memory cell 201 on the assumption that the threshold voltage of the memory cell 201 is set to Vth_low. Thereby, in the cases illustrated in FIG. 10A and FIG. 10B, the control unit 21 decides that the threshold voltage of the memory cell 201 reaches the voltage range for read limit. Since when estimation is performed, whether actually stored data is the Low-side data or the High-side data is not clarified, the control unit 21 decides whether the threshold voltage of the memory cell 201 reaches the voltage range for read limit from the estimated value of the current threshold voltage of the memory cell 201 obtained when the threshold voltage has been set to Vth_low on the assumption that the stored data is the Low-side data. Incidentally, in the state illustrated in FIG. 10C, since the estimated value of the current threshold voltage of the memory cell 201 obtained when the threshold voltage has been set to Vth_low does not reach the voltage range for read limit (that is, since later described ΔVth is negative as illustrated in FIG. 10C), the control unit 21 does not decide that the threshold voltage of the memory cell 201 reaches the voltage range for read limit.

When the estimated value is obtained, the control unit 21 calculates the difference ΔVth by subtracting the lower-limit value in the voltage range for read limit which is known in advance from the estimated value. The control unit 21 manipulates the threshold voltage so as to decrease the threshold voltage of the memory cell 201 by ΔVth after calculation of the difference ΔVth.

Figure 11:
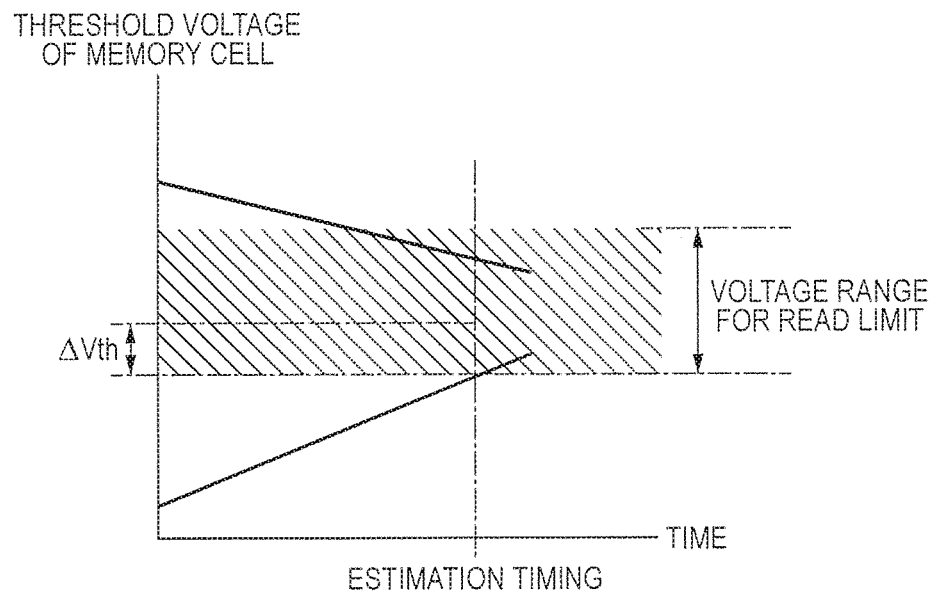
FIG. 11 is a graph illustrating one example of a situation when a control unit has manipulated a threshold voltage in the state illustrated in FIG. 10A.

FIG. 11 is a graph illustrating one example of a case where the control unit 21 has manipulated the threshold voltage in the state illustrated in FIG. 10A. Incidentally, also when the control unit 21 has manipulated the threshold voltage in the state illustrated in FIG. 10B, the threshold voltage of the memory cell 201 decreases by ΔVth similarly to the case illustrated in FIG. 11. As illustrated in FIG. 11, the current threshold voltage of the memory cell 201 whose threshold voltage has been set to Vth_low gets out of the voltage range for read limit by manipulation of the threshold voltage by the control unit 21. Accordingly, when the memory cell 202 stores therein the Low-side data, the Low-side data is normally acquired as the read data by performing the reading process after manipulation of the threshold voltage. On the other hand, when the memory cell 202 stores therein the High-side data, the High-side data is normally acquired as the read data or the read data becomes indefinite by performing the reading process after manipulation of the threshold voltage. That is, in a case where the memory cell 202 stores therein the High-side data, when the value of the threshold voltage of the memory cell 201 is higher than the upper-limit voltage value in the voltage range for read limit still after manipulation of the threshold voltage, the High-side data is acquired as the read data. In addition, in a case where the memory cell 201 stores therein the High-side data, when the value of the threshold voltage of the memory cell 201 is in the voltage range for read limit after manipulation of the threshold voltage, the read data becomes indefinite. Incidentally, it is possible to decide whether the read data is indefinite by, for example, repetitively performing the reading process so as to see whether the same read data is typically obtained. Incidentally, in the repetitively performed reading process, the reading process may be performed by slightly increasing/decreasing the threshold voltage which has been changed by ΔVth by a variable value which has been defined in advance. In the second embodiment, even when the estimated value of the threshold voltage of the memory cell 201 reaches the voltage range for read limit, it is possible to acquire the data stored in the memory cell 201 by manipulating the voltage value of the threshold voltage of the memory cell 201 in this way.

Here, supplemental description of the above will be made. Although the data which is stored in the memory cell 201 is unknown at the time point of estimation of the threshold voltage of the memory cell 201, it is possible to decide whether the threshold voltage reaches the voltage range for read limit as described above. In particular, it is possible to accurately decide whether the reading process is normally performed. This is because when the estimated value of the threshold voltage does not reach the voltage range for read limit, it is typically possible to read the data as long as the memory cell 201 is not destroyed owing to presence of the above-mentioned margins.

In addition, as described above, in the second embodiment, when it has been decided that the threshold voltage reaches the voltage range for read limit, the control unit 21 regards the stored data as the Low-side data, calculates ΔVth used for making the Low-side data reach a normally readable level and performs the erasing process by ΔVth. Then, the control unit 21 acquires a result of decision of a cell current obtained when a predetermined voltage for the reading process has been applied to the memory cell 201 from the current comparison circuit 23. When the result of decision so acquired indicates the Low-side data, it is found that the data which has been stored in the memory cell 201 has been the Low-side data. Then, when the result of decision indicates the High-side data or when whether it is the High-side data or the Low-side data is not uniquely defined, it is found that the data which has been stored in the memory cell 201 has been the High-side data.

This is because after the threshold voltage has been reset to the voltage value which makes it possible to normally read the data as the Low-side data by manipulation of the threshold voltage, it is typically possible to normally read the data as the Low-side data as long as the memory cell 201 is not destroyed owing to presence of the above-mentioned margins. In addition, since the amount of the threshold voltage which has been changed by manipulation of the threshold voltage is limited to ΔVth, even when the data which is stored in the memory cell 201 is the High-side data, the threshold voltage of the memory cell 201 which is obtained after manipulation is at least the lower limit value in the voltage range for read limit. That is, it may be said that the threshold voltage of the memory cell 201 in which the High-side data is stored is typically higher than the lower limit value in the voltage range for read limit still after manipulation of the threshold voltage has been performed. This is because the above-mentioned margins are present. Accordingly, when the High-side data is stored, the read data is not acquired normally as the Low-side data after manipulation of the threshold voltage.

Incidentally, in the second embodiment, since in the state illustrated in FIG. 10C, the estimated value of the current threshold voltage of the memory cell 201 whose threshold voltage has been assumed to be set to Vth_low does not reach the voltage range for read limit, the reading process is performed without performing the threshold voltage changing process. In this case, when the data which is actually stored in the memory cell 201 is the Low-side data, the Low-side data is normally acquired as the read data. On the other hand, when the data which is actually stored in the memory cell 201 is the High-side data, the read data would become indefinite. However, as described above, in the second embodiment, since estimation that the margins have been considered is performed, it is presumed that the actual threshold voltage of the memory dell 201 is higher than a voltage in the voltage range for read limit. Accordingly, also when the data which is actually stored in the memory cell 201 is the High-side data, it is expected that the High-side data is normally acquired. Incidentally, when the data which is actually stored in the memory cell 201 is the High-side data in the state illustrated in FIG. 10C, also the value of the current threshold voltage of the memory cell 201 whose threshold voltage has been assumed to be set to Vth_high may be estimated in order to more surely acquire the data. This is because it is possible to specify that the read data is in the state illustrated in FIG. 10C from the estimated value of the memory cell 201 whose threshold voltage has been assumed to be set to Vth_low and the estimated value of the memory cell 201 whose threshold voltage has been assumed to be set to Vth_high. In addition, in a case where it has become possible to specify that the read data is in the state illustrated in FIG. 10C, when the High-side data is normally acquired as the read data or the read data becomes indefinite, it is possible to specify that the High-side data has been stored in the memory cell 201.

Figure 12:
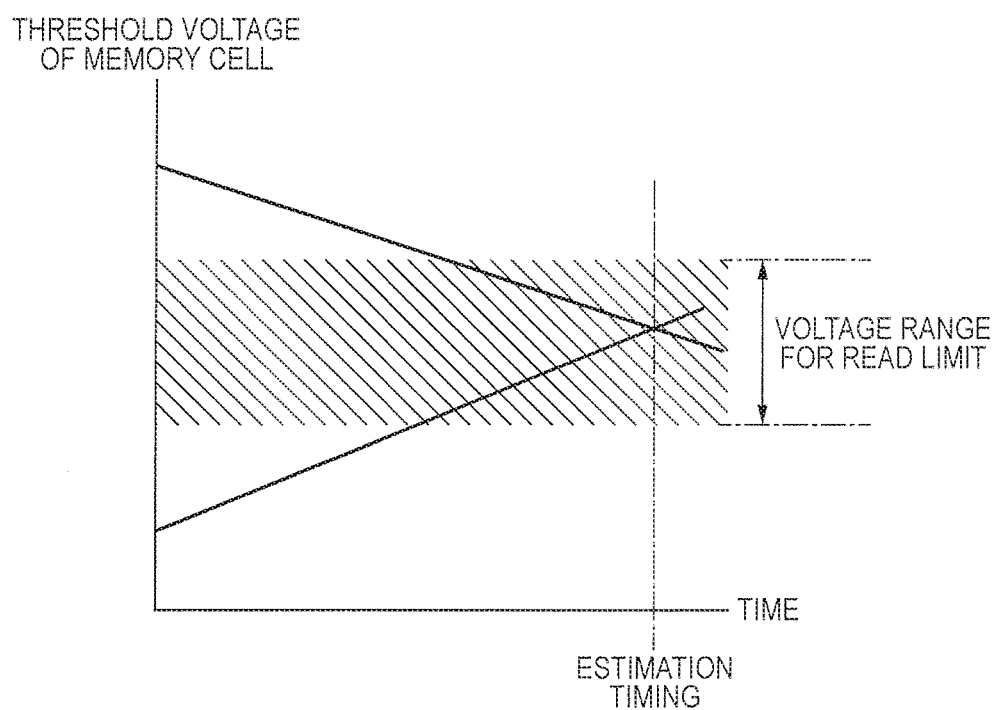
FIG. 12 is a graph illustrating one example of a state where the read data of the memory cell becomes indefinite.

As described above, according to the second embodiment, it becomes possible to acquire the read data as long as the reading process is performed before the timing that the retention characteristic of the memory cell 201 whose threshold voltage has been set to Vth_low intersects with the retention characteristic of the memory cell 201 whose threshold voltage has been set to Vth_high. However, as illustrated in FIG. 12, when the time has elapsed to a time point that the retention characteristic of the memory cell 201 whose threshold voltage has been set to Vth_low intersects with the retention characteristic of the memory cell 201 whose threshold voltage has been set to Vth_high and when the time has elapsed to a time point that the threshold voltage of the timer cell 202 reaches the voltage range for read limit, the read data is not ensured.

Figure 13A:
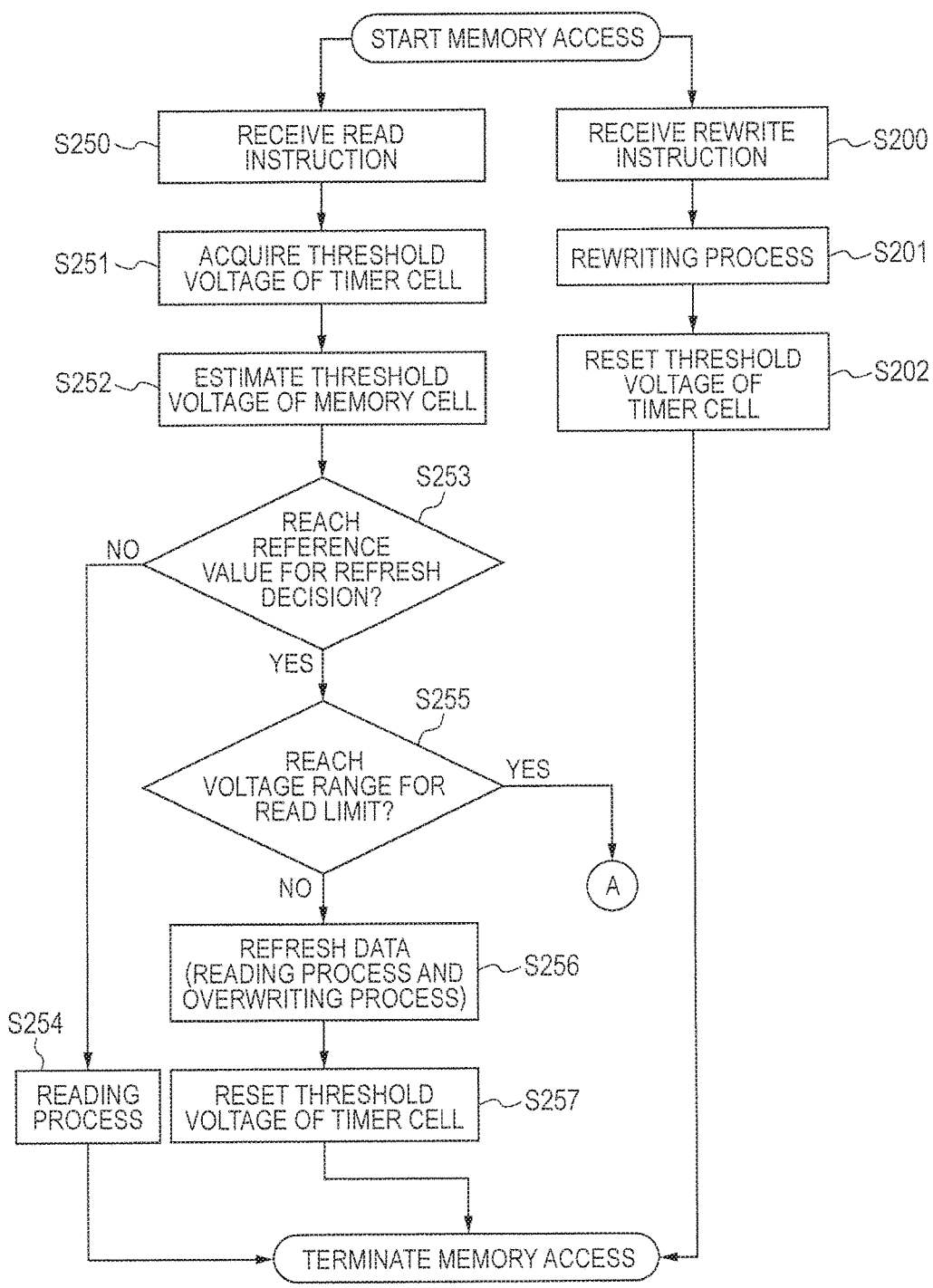
FIG. 13A is a flowchart illustrating one example of an operation of the storage device according to the second embodiment.
Figure 13B:
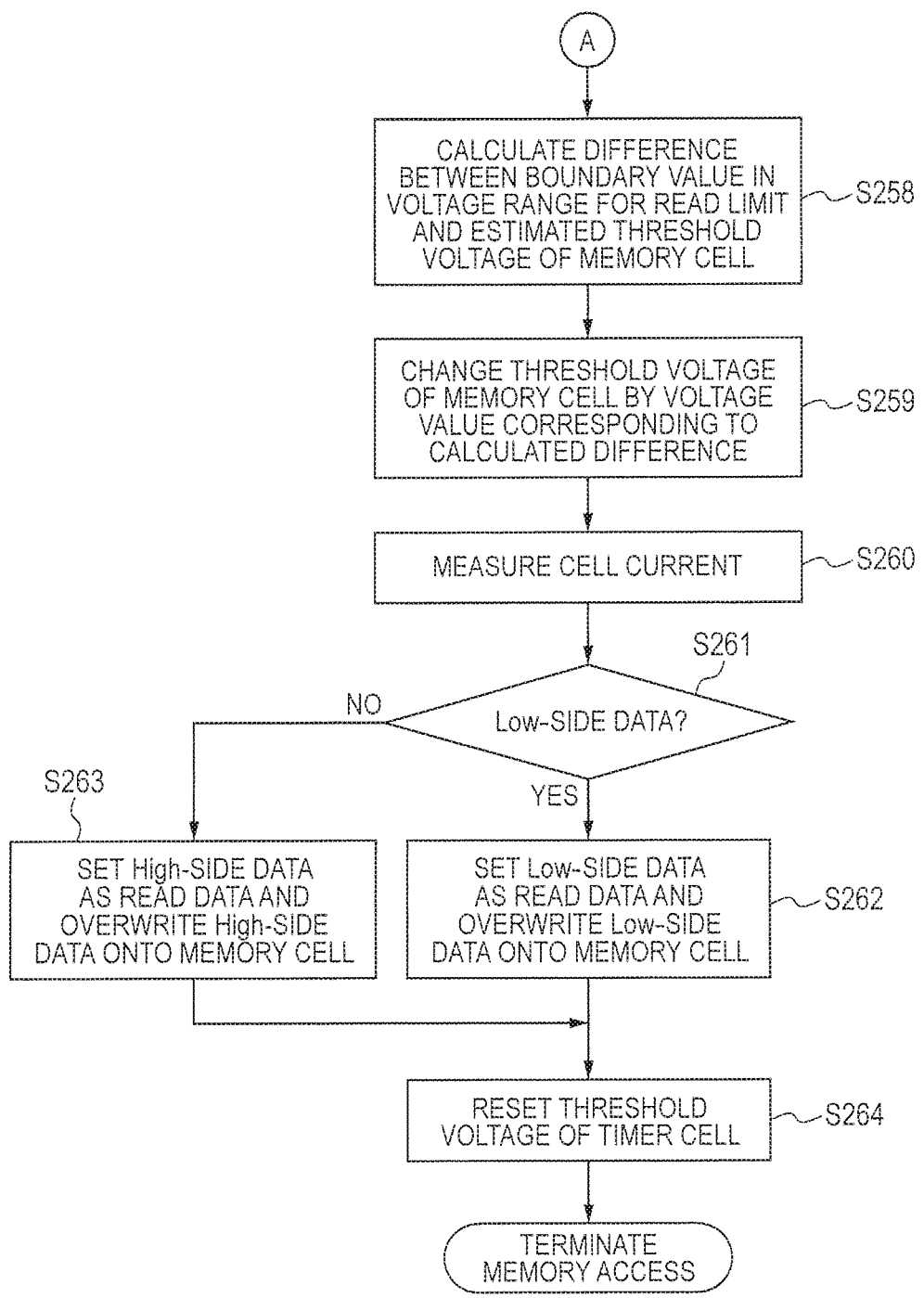
FIG. 13B is a flowchart illustrating one example of the operation of the storage device according to the second embodiment.

Next, examples of operations of the storage device 2 according to the second embodiment will be described. FIG. 13A and FIG. 13B are flowcharts each illustrating one example of the operation of the storage device 2 according to the second embodiment. First, one example of the operation performed in data rewriting by the storage device 2 will be described.

In step 200 (S200), the storage device 2 receives a rewrite instruction from another device and so forth. Next, in step 201 (S201), the control unit 21 performs the rewriting process on the memory cell 201. Next, in step 202 (S202), the control unit 21 performs the resetting process on the timer cell 202 corresponding to the memory block 200 as the data rewriting object. The foregoing is the operation performed when data rewriting.

Next, one example of the operation performed when data reading will be described.

In step 250 (S250), the storage device 2 receives the read instruction from another device and so forth. Next, in step 251 (S251), the control unit 21 acquires the current threshold voltage of the timer cell 202 of the memory block 200 as the data reading object.

Next, in step 252 (S252), the control unit 21 estimates the voltage value of the current threshold voltage of the memory cell 201 as the data reading object from the current threshold voltage of the timer cell 202 which has been acquired in step 251 (S251). Specifically, the control unit 21 acquires the estimated value of the current threshold voltage of the memory cell 201 on the assumption that the threshold voltage of the memory cell 201 as the data reading object has been set to Vth_low.

Next, in step 253 (S253), the control unit 21 decides whether the threshold voltage which has been estimated in step 252 (S252) reaches the refresh reference value. When it has been decided that the threshold voltage does not reach the refresh reference value, the process proceeds to step 254 (S254) and when it has been decided that the threshold voltage reaches the refresh reference value, the process proceeds to step 255 (S255). In step 254 (S254), since the state of the threshold voltage of the memory cell 201 is at the normal level, the control unit 21 performs the data reading process on the memory cell 201.

On the other hand, in step 255 (S255), the control unit 21 decides whether the threshold voltage which has been estimated in step 252 (S252) reaches the read limit reference value. When it has been decided that the threshold voltage does not reach the read limit reference value, the process proceeds to step 256 (S256). When it has been decided that the threshold voltage reaches the read limit reference value, the process proceeds to step 258 in order to acquire the read data after the threshold voltage changing process has been performed.

In step 256 (S256), the control unit 21 performs the refreshing process in addition to the reading process. That is, the control unit 21 performs the reading process and performs an overwriting process on the memory cell 201 on the basis of the read data. Then, the process proceeds to step 257 (S257). In step 257 (S257), the control unit 21 performs the resetting process on the threshold voltage of the timer cell 202.

When it has been decided that the threshold voltage of the memory cell 201 reaches the read limit reference value, in step 258 (S258), the control unit 21 calculates a difference between the boundary value in the voltage range for read limit and the threshold voltage which has been estimated in step 252 (S252). Next, in step 259 (S259), the control unit 21 changes the threshold voltage of the memory cell 201 by a voltage value corresponding to the difference which has been calculated in step 258 (S258).

Next, in step 260 (S260), the control unit 21 acquires the result of decision of the cell current obtained when the predetermined voltage has been applied to the memory cell 201 for the reading process from the current comparison circuit 23. Then, in step 261 (S261), the control unit 21 decides whether the result of decision of the cell current indicates the Low-side data. When the result of decision of the cell current indicates the Low-side data, the process proceeds to step 262 (S262). When the result of decision of the cell current does not indicate the Low-side data, that is, when the result of decision indicates the High-side data or when the result of decision is indefinite, the process proceeds to step 263 (S263).

In step 262 (S262), the control unit 21 acquires the Low-side data as the read data. In addition, the control unit 21 performs the overwriting process on the memory cell 202 on the basis of the read data. Then, the process proceeds to step 264 (S264). In step 263 (S263), the control unit 21 acquires the High-side data as the read data. In addition, the control unit 21 performs the overwriting process on the memory cell 201 on the basis of the read data.

The control unit 21 writes the data which is the same as the read data acquired after the threshold voltage has been changed again into the memory cell 201 in this way. Accordingly, the threshold voltage is recovered and it becomes possible to make the retention period long.

Then, the process proceeds to step 264 (S264). In step 264 (S264), the control unit 21 performs the resetting process on the threshold voltage of the timer cell 202 which has been acquired in step 251 (S251). In the foregoing, the example of the operation performed in data reading has been described.

The storage device 2 according to the second embodiment has been described above. According to the second embodiment, when it has been presumed that the threshold voltage of the memory cell 201 rushes into the voltage range for read limit, the threshold value changing process is performed and thereby the read data is acquired. Accordingly, even when it has been presumed that the threshold voltage of the memory cell 201 rushes into the voltage range for read limit, it is possible to acquire the read data. Incidentally, although in the second embodiment, the timer cell 202 is installed for every memory cell group which is the rewrite unit, one timer cell 202 may be installed for the storage device 2. In addition, the timer cell 202 may be installed for every predetermined number of memory blocks.

Altered Example of Second Embodiment

Next, an altered example of the second embodiment will be described. Although in the above-mentioned second embodiment, the value of the current threshold voltage of the memory cell 201 is estimated by using the timer cell 202, in this altered example, the value of the current threshold voltage of the memory cell 201 is estimated by using a timer.

Figure 14:
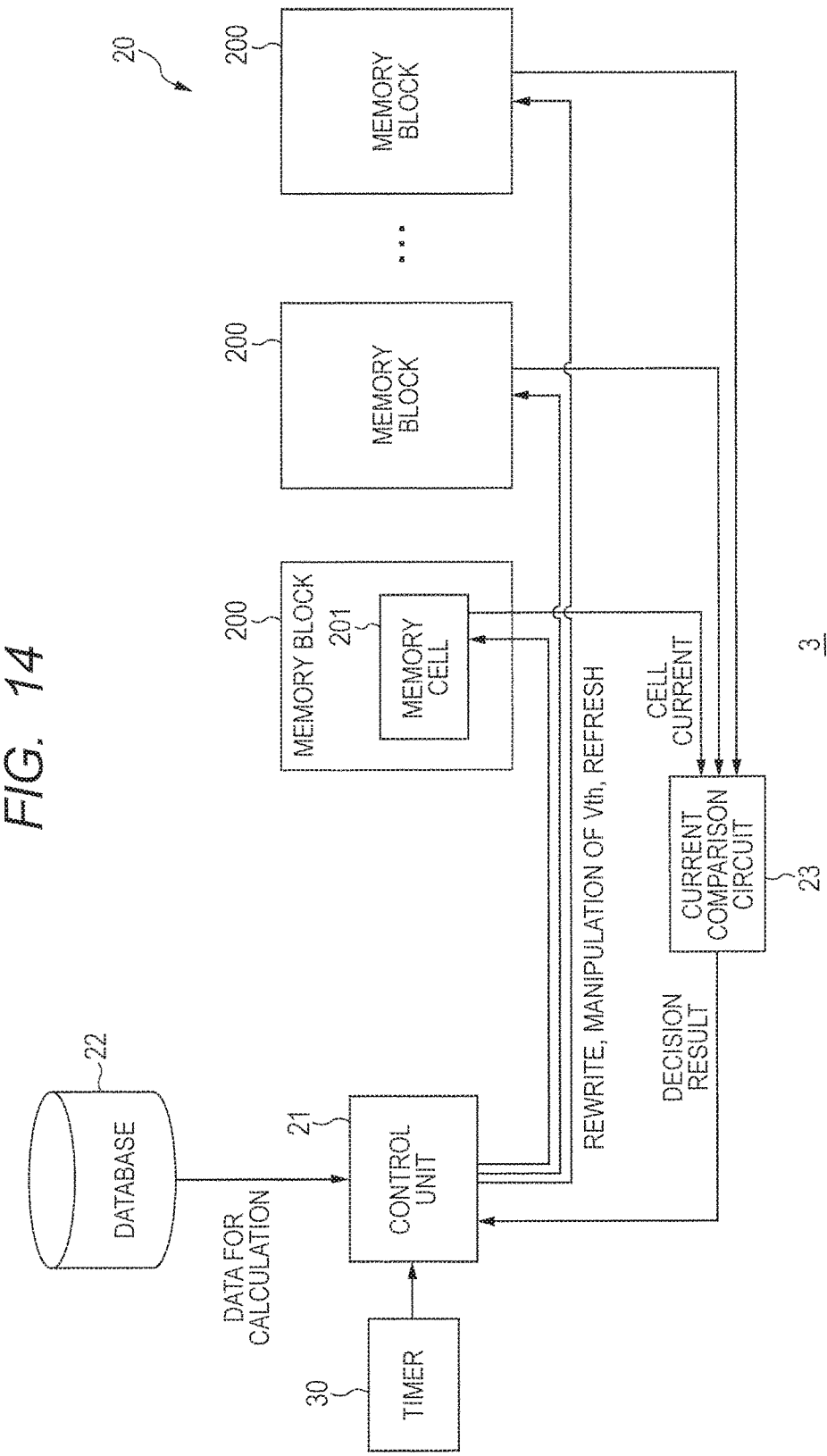
FIG. 14 is a block diagram illustrating one example of a configuration of a storage device according to an altered example of the second embodiment.

FIG. 14 is a block diagram illustrating one example of a configuration of a storage device 3 according to the altered example of the second embodiment. As illustrated in FIG. 14, each memory block 200 does not include the timer cell 202 unlike the storage device 2 according to the second embodiment. Each memory block 200 includes a timer 30 in place of the timer cell 202. The timer 30 is an electronic circuit which measures a time. The timer 30 may be the RTC. In addition, in the storage device 2 according to the second embodiment, the database 22 stores therein the correspondence relation between the retention characteristic of the timer cell 202 and the retention characteristic of the memory cell 201. However, the database 22 of the storage device 3 according to the altered example stores therein the retention characteristic of the memory cell 201 in place of the above-mentioned correspondence relation. The database 22 stores therein, for example, such a table as illustrated in FIG. 15 in order to store the retention characteristic of the memory cell 201.

In the altered example, the control unit 21 calculates the elapsed time from a time which has been acquired from the timer 30 when data writing has been performed and a time which has been acquired from the timer 30 when data reading has been performed. Then, the control unit 21 acquires the estimated value of the current threshold voltage of the memory cell 201 from the calculated elapsed time and the retention characteristic of the memory cell 201 which is stored in the database 22. Since the operation that the storage device 3 performs after estimation of the estimated value of the current threshold voltage of the memory cell 201 is the same as that of the storage device 2 according to the second embodiment, description thereof is omitted.

In the altered example, although it is requested to install the timer circuit, it is possible to acquire the read data even when it is presumed that the threshold voltage of the memory cell 201 rushes into the voltage range for read limit similarly to the second embodiment.

Although, in the foregoing, the invention which has been made by the inventors and others of the present application has been specifically described on the basis of the preferred embodiments, it goes without saying that the present invention is not limited to the above-mentioned embodiments and may be altered and modified in a variety of ways within a range not deviating from the gist of the present invention. For example, although in the above-mentioned embodiments, the margins are prepared respectively for the retention characteristic of the timer cell and the retention characteristic of the memory cell which are used for estimation, the margin may be prepared for only one of these retention characteristics and may not be prepared for both of them. However, in order to suppress the possibility that the read data may be erroneously acquired, it is preferable to perform estimation in a state where the margins have been prepared for the both retention characteristics.

In addition, in the above-mentioned second embodiment and altered example thereof, the control unit 21 estimates the value of the current threshold voltage of the memory cell 201 whose threshold voltage has been set to Vth_low on the assumption that the memory cell 201 as the data reading object is the memory cell in which the Low-side data is stored. However, the control unit 21 may estimate the value of the current threshold voltage of the memory cell 201 whose threshold voltage has been set to Vth_high on the assumption that the memory cell 201 as the data reading object is the memory cell in which the High-side data is stored. In this case, when it is decided that the estimated value of the current threshold voltage rushes into the voltage range for read limit, the control unit 21 calculates a difference between the upper-limit voltage value in the voltage range for read limit and the estimated value of the threshold voltage. Then, the control unit 21 increases the threshold voltage of the memory cell 201 by a voltage value corresponding to the calculated difference. Then, the control unit 21 performs the reading process on the memory cell 201. On this occasion, when the result of decision of the cell current indicates the High-side data, the control unit 21 acquires the High-side data as the read data, and when the result of decision of the cell current does not indicate the High-side data, that is, when the result of decision indicates the Low-side data or when the result of decision is indefinite, the control unit 21 acquires the Low-side data as the read data.

In addition, although in the foregoing description, the respective embodiments have been described as hardware configurations, the respective embodiments are not limited to the hardware configurations. In each embodiment, it is also possible to implement an optional process by making a processor such as the CPU (Central Processing Unit) and so forth execute a computer program.

In addition, it is possible to store the above-mentioned program using various types of non-transitory computer readable media and then to supply the program to a computer. The non-transitory computer readable media include various types of tangible storage media. Examples of the non-transitory computer readable media include a magnetic recording medium (for example, a flexible disc, a magnetic tape, a hard disc drive and so forth), a magneto-optical recording medium (for example, a magneto-optical disc and so forth), a CD-ROM (Read Only Memory), a CD-R, a CD-R/W, a semiconductor memory (for example, a mask ROM, a PROM (Programmable ROM), an EPROM (Erasable PROM), a flash ROM, a RAM (Random Access Memory) and so forth. In addition, the program may be supplied to the computer by using various types of transitory computer readable media. Examples of the transitory computer readable media include an electric signal, an optical signal, an electromagnetic wave and so forth. It is possible for the transitory computer readable media to supply the program to the computer via cable communication paths such as an electric wire, an optical fiber and so forth and/or radio communication paths.

In addition, the storage device according to the above-mentioned embodiments and altered example may be described also in the form of additional remarks as follows.

(Additional Remark 1)

The storage device including the timer circuit, the storage unit which stores the retention characteristic of the flash memory cell, and the estimation unit which estimates the current threshold voltage of the flash memory cell by using the elapsed time which has been measured by the timer circuit and the retention characteristic which has been stored in the storage unit and decides whether the current threshold voltage reaches the predetermined voltage range within which the read data of the flash memory cell becomes indefinite.

(Additional Remarks 2)

The storage device described in the additional remark 1, further including the control unit which changes the threshold voltage by the voltage value corresponding to the difference between the estimated threshold voltage and the boundary value in the voltage range and thereafter acquires the read data of the flash memory cell when it has been decided that the threshold voltage reaches the voltage range.

(Additional Remark 3)

The storage device described in the additional remark 2, in which the control unit writes the data which is the same as the read data which has been acquired after the threshold voltage has been changed again into the flash memory cell.

What is claimed is:

1. A storage device comprising:
a plurality of flash memory cells;
a control unit which writes data into one memory cell which is used as the cell which stores data therein in the plurality of flash memory cells and performs resetting of a threshold voltage of one cell for decision used for decision of the threshold voltage of the memory cell in the flash memory cells, and
an estimation unit which estimates a state of a second threshold voltage which is the current threshold voltage of the memory cell on the basis of a first threshold voltage which is the current threshold voltage of the cell for decision.

2. The storage device according to claim 1,
wherein in resetting of the threshold voltage, the first threshold voltage is set to a predetermined initial value which is higher than an upper-limit voltage value in a predetermined voltage range within which read data of the memory cell becomes indefinite,
wherein when the first threshold voltage is lower than a first predetermined value, the estimation unit estimates that the second threshold voltage is in a state where refreshing is requested, and
wherein when the second threshold voltage has been estimated to be in the state where refreshing is requested by the estimation unit, the control unit writes data which is the same as the read data of the memory cell again into the memory cell.

3. The storage device according to claim 2,
wherein when the first threshold voltage is lower than a second predetermined value which is lower than the first predetermined value, the estimation unit estimates that the second threshold voltage is in a state where the read data of the memory cell becomes indefinite, and
wherein when the second threshold voltage has been estimated to be in the state where refreshing is requested and the second threshold voltage has been estimated to be not in the state where the read data of the memory cell becomes indefinite by the estimation unit, the control unit writes data which is the same as the read data of the memory cell again into the memory cell.

4. The storage device according to claim 1,
wherein in resetting of the threshold voltage of the cell for decision, the first threshold voltage is set to a predetermined initial value which is lower than a lower-limit voltage value in a predetermined voltage range within which read data of the memory cell becomes indefinite,
wherein when the first threshold voltage is higher than a first predetermined value, the estimation unit estimates that the second threshold voltage is in a state where refreshing is requested, and
wherein when the second threshold voltage has been estimated to be in the state where refreshing is requested by the estimation unit, the control unit writes data which is the same as the read data of the memory cell again into the memory cell.

5. The storage device according to claim 4,
wherein when the first threshold voltage is higher than a second predetermined value which is higher than the first predetermined value, the estimation unit estimates that the second threshold voltage is in a state where the read data of the memory cell becomes indefinite, and
wherein when the second threshold voltage has been estimated to be in the state where refreshing is requested and the second threshold voltage has been estimated to be not in the state where the read data of the memory cell becomes indefinite by the estimation unit, the control unit writes data which is the same as the read data of the memory cell again into the memory cell.

6. The storage device according to claim 1, further comprising:
a storage unit which stores a correspondence relation between a first retention characteristic which is the retention characteristic of the cell for decision and a second retention characteristic which is the retention characteristic of the memory cell,
wherein the estimation unit estimates the second threshold voltage from the first threshold voltage by using the correspondence relation which has been stored in the storage unit and decides whether the second threshold voltage reaches a predetermined voltage range within which the read data of the memory cell becomes indefinite.

7. The storage device according to claim 6,
wherein a degree of time-dependent change in the first threshold voltage that the first retention characteristic in the correspondence relation stored in the storage unit indicates is smaller than a degree of actual time-dependent change in the first threshold voltage and a degree of time-dependent change in the second threshold voltage that the second retention characteristic in the correspondence relation stored in the storage unit indicates is larger than a degree of actual time-dependent change in the second threshold voltage.

8. The storage device according to claim 6,
wherein when the second threshold voltage has been estimated to reach the voltage range, the control unit changes the second threshold voltage by a voltage value corresponding to a difference between the estimated second threshold voltage and a boundary value of the voltage range and thereafter acquires the read data of the memory cell.

9. The storage device according to claim 8,
wherein the control unit writes data which is the same as the read data which has been acquired after the second threshold voltage has been changed again into the memory cell.

10. The storage device according to claim 1,
wherein the cell for decision is installed for every memory cell group which is a rewrite unit.

11. A method for managing storage device comprising:
writing data into a memory cell which is used as a cell which stores data therein in a plurality of flash memory cells and performing resetting of a threshold voltage of a cell for decision which is used for decision of a threshold voltage of the memory cell in the flash memory cells, and estimating a state of a second threshold value which is the current threshold voltage of the memory cell on the basis of a first threshold voltage which is the current threshold voltage of the cell for decision.

* * * * *